(12) United States Patent
Wang et al.

(10) Patent No.: US 11,184,006 B2
(45) Date of Patent: Nov. 23, 2021

(54) TECHNIQUES FOR MANIPULATION OF TWO-QUBIT QUANTUM STATES AND RELATED SYSTEMS AND METHODS

(71) Applicant: Yale University, New Haven, CT (US)

(72) Inventors: Chen Wang, New Haven, CT (US); Yvonne Gao, New Haven, CT (US); Luigi Frunzio, North Haven, CT (US); Michel Devoret, New Haven, CT (US); Robert J. Schoelkopf, III, Madison, CT (US)

(73) Assignee: Yale University, New Haven, CT (US)

(*) Notice: Subject to any disclaimer, the term of this patent is extended or adjusted under 35 U.S.C. 154(b) by 0 days.

(21) Appl. No.: 16/068,405

(22) PCT Filed: Jan. 13, 2017

(86) PCT No.: PCT/US2017/013426
§ 371 (c)(1),
(2) Date: Jul. 6, 2018

(87) PCT Pub. No.: WO2017/123940
PCT Pub. Date: Jul. 20, 2017

(65) Prior Publication Data
US 2019/0020346 A1  Jan. 17, 2019

Related U.S. Application Data

(60) Provisional application No. 62/335,591, filed on May 12, 2016, provisional application No. 62/279,624, filed on Jan. 15, 2016.

(51) Int. Cl.
*H03K 19/195* (2006.01)
*B82Y 10/00* (2011.01)
(Continued)

(52) U.S. Cl.
CPC ............ *H03K 19/195* (2013.01); *B82Y 10/00* (2013.01); *G06N 10/00* (2019.01); *H03B 5/1847* (2013.01); *H04B 10/70* (2013.01)

(58) Field of Classification Search
CPC .... H03K 19/195; H03B 5/1847; B82Y 10/00; G06N 99/002; G06N 99/02; G06N 10/00; H04B 10/70
(Continued)

(56) References Cited

U.S. PATENT DOCUMENTS

| 3,275,943 A | 9/1966 | Robert |
| 3,663,886 A | 5/1972 | Blume |

(Continued)

FOREIGN PATENT DOCUMENTS

| CA | 2 470 845 A1 | 6/2003 |
| CN | 101548512 A | 9/2009 |

(Continued)

OTHER PUBLICATIONS

Paik et al Physics Rev. Lett. 107, 240501(2011) (Year: 2011).*

(Continued)

*Primary Examiner* — Arnold M Kinkead
(74) *Attorney, Agent, or Firm* — Wolf, Greenfield & Sacks, P.C.

(57) ABSTRACT

According to some aspects, a method is provided of operating a system that includes a multi-level quantum system dispersively coupled to a first quantum mechanical oscillator and dispersively coupled to a second quantum mechanical oscillator, the method comprising applying a first drive waveform to the multi-level quantum system, applying one or more second drive waveforms to the first quantum mechanical oscillator, and applying one or more third drive waveforms to the second quantum mechanical oscillator.

26 Claims, 8 Drawing Sheets

(51) Int. Cl.
*G06N 10/00* (2019.01)
*H04B 10/70* (2013.01)
*H03B 5/18* (2006.01)

(58) Field of Classification Search
USPC .......... 331/107 T; 703/15; 257/31; 505/170; 326/3, 4, 5
See application file for complete search history.

(56) References Cited

U.S. PATENT DOCUMENTS

| | | | |
|---|---|---|---|
| 4,344,052 A | 8/1982 | Davidson | |
| 4,403,189 A | 9/1983 | Simmonds | |
| 4,585,999 A | 4/1986 | Hilbert et al. | |
| 4,956,312 A | 9/1990 | Van Laarhoven | |
| 5,105,166 A | 4/1992 | Tsukii et al. | |
| 5,254,950 A | 10/1993 | Fan et al. | |
| 5,326,986 A | 7/1994 | Miller, Jr. et al. | |
| 5,420,100 A | 5/1995 | Vittoria et al. | |
| 5,493,719 A | 2/1996 | Smith et al. | |
| 5,582,877 A | 12/1996 | Nagamachi et al. | |
| 5,635,834 A | 6/1997 | Sloggett et al. | |
| 5,661,494 A | 8/1997 | Bondyopadhyay | |
| 5,920,811 A | 7/1999 | Suzuki et al. | |
| 6,549,059 B1 | 4/2003 | Johnson | |
| 6,578,018 B1 | 6/2003 | Ulyanov | |
| 6,621,374 B2 | 9/2003 | Higgins et al. | |
| 6,627,915 B1 | 9/2003 | Ustinov et al. | |
| 6,635,898 B2 | 10/2003 | Williams et al. | |
| 6,822,255 B2 | 11/2004 | Tzalenchuk et al. | |
| 6,838,694 B2 | 1/2005 | Esteve et al. | |
| 6,900,454 B2 | 5/2005 | Blais et al. | |
| 6,911,664 B2 | 6/2005 | Il'ichev et al. | |
| 6,943,368 B2 | 9/2005 | Amin et al. | |
| 7,042,005 B2 | 5/2006 | Il'ichev et al. | |
| 7,129,869 B2 | 10/2006 | Furuta et al. | |
| 7,253,654 B2 | 8/2007 | Amin | |
| 7,307,275 B2 | 12/2007 | Lidar et al. | |
| 7,364,923 B2 | 4/2008 | Lidar et al. | |
| 7,369,093 B2 | 5/2008 | Oppenländer et al. | |
| 7,443,720 B2 | 10/2008 | Astafiev et al. | |
| 7,498,832 B2 | 3/2009 | Baumgardner et al. | |
| 7,533,068 B2 | 5/2009 | Maassen van den Brink et al. | |
| 7,724,083 B2 | 5/2010 | Herring et al. | |
| 7,800,395 B2 | 9/2010 | Johnson et al. | |
| 7,876,248 B2 | 1/2011 | Berkley et al. | |
| 7,899,092 B2 | 3/2011 | Malinovsky | |
| 7,932,515 B2 | 4/2011 | Bunyk et al. | |
| 8,032,474 B2 | 10/2011 | Macready et al. | |
| 8,106,717 B2 | 1/2012 | Ichimura et al. | |
| 8,111,083 B1 | 2/2012 | Pesetski et al. | |
| 8,138,784 B2 | 3/2012 | Przybysz et al. | |
| 8,179,133 B1 | 5/2012 | Kornev et al. | |
| 8,234,103 B2 * | 7/2012 | Biamonte ............... B82Y 10/00 703/15 | |
| 8,416,109 B2 | 4/2013 | Kirichenko | |
| 8,508,280 B2 | 8/2013 | Naaman et al. | |
| 8,514,478 B1 | 8/2013 | Spence | |
| 8,922,239 B2 | 12/2014 | Pesetski et al. | |
| 9,467,126 B1 | 10/2016 | Naaman et al. | |
| 9,892,365 B2 | 2/2018 | Rigetti et al. | |
| 9,948,254 B2 | 4/2018 | Narla et al. | |
| 10,305,015 B1 * | 5/2019 | Brink .................. H01L 39/2416 | |
| 2001/0025012 A1 | 9/2001 | Tarutani et al. | |
| 2002/0188578 A1 | 12/2002 | Amin et al. | |
| 2003/0136973 A1 | 7/2003 | Ogawa et al. | |
| 2003/0193097 A1 | 10/2003 | Il'ichev et al. | |
| 2004/0059760 A1 | 3/2004 | Ageishi et al. | |
| 2004/0077503 A1 | 4/2004 | Blais et al. | |
| 2004/0140537 A1 | 7/2004 | Il'ichev et al. | |
| 2005/0001209 A1 | 1/2005 | Hilton et al. | |
| 2005/0117836 A1 | 6/2005 | Franson et al. | |
| 2005/0134377 A1 | 6/2005 | Dent | |
| 2005/0224784 A1 | 10/2005 | Amin et al. | |
| 2006/0097747 A1 | 5/2006 | Amin | |
| 2006/0179029 A1 | 8/2006 | Vala et al. | |
| 2007/0215862 A1 | 9/2007 | Beausoleil et al. | |
| 2007/0296953 A1 | 12/2007 | Allen et al. | |
| 2008/0100175 A1 | 5/2008 | Clark | |
| 2008/0274898 A1 | 11/2008 | Johnson et al. | |
| 2008/0297230 A1 | 12/2008 | Dzurak et al. | |
| 2009/0028340 A1 | 1/2009 | Trifonov | |
| 2009/0033369 A1 | 2/2009 | Baumgardner et al. | |
| 2009/0074355 A1 | 3/2009 | Beausoleil et al. | |
| 2009/0153180 A1 | 6/2009 | Herring et al. | |
| 2009/0232191 A1 | 9/2009 | Gupta et al. | |
| 2009/0258787 A1 | 10/2009 | Wilkie et al. | |
| 2009/0289638 A1 | 11/2009 | Farinelli et al. | |
| 2010/0241780 A1 | 9/2010 | Friesen | |
| 2010/0246152 A1 | 9/2010 | Lin et al. | |
| 2011/0060710 A1 | 3/2011 | Amin | |
| 2011/0079889 A1 | 4/2011 | Baillin | |
| 2012/0074509 A1 | 3/2012 | Berg et al. | |
| 2012/0319085 A1 | 12/2012 | Gambetta et al. | |
| 2012/0319684 A1 | 12/2012 | Gambetta et al. | |
| 2012/0326130 A1 | 12/2012 | Maekawa et al. | |
| 2012/0326720 A1 | 12/2012 | Gambetta et al. | |
| 2013/0029848 A1 | 1/2013 | Gonzalez et al. | |
| 2013/0043945 A1 | 2/2013 | McDermott et al. | |
| 2013/0107352 A1 | 5/2013 | Santori et al. | |
| 2013/0196855 A1 | 8/2013 | Poletto et al. | |
| 2013/0271265 A1 | 10/2013 | Finn | |
| 2014/0167836 A1 | 6/2014 | Gambetta et al. | |
| 2014/0176203 A1 | 6/2014 | Matheny et al. | |
| 2014/0314419 A1 | 10/2014 | Paik | |
| 2015/0241481 A1 | 8/2015 | Narla et al. | |
| 2016/0308502 A1 | 10/2016 | Abdo et al. | |
| 2017/0039481 A1 | 2/2017 | Abdo | |
| 2018/0040935 A1 | 2/2018 | Sliwa et al. | |
| 2018/0054165 A1 | 2/2018 | Szocs et al. | |
| 2018/0138987 A1 | 5/2018 | Sliwa et al. | |
| 2018/0198427 A1 | 7/2018 | Narla et al. | |
| 2018/0247217 A1 * | 8/2018 | Heeres .................. G06N 10/00 | |
| 2019/0190474 A1 | 6/2019 | Abdo et al. | |
| 2020/0258003 A1 * | 8/2020 | Rigetti .................. G06N 10/00 | |
| 2020/0287540 A1 * | 9/2020 | Smith .................... H01L 27/18 | |
| 2020/0334104 A1 * | 10/2020 | Rosenblum ......... G06F 11/1004 | |

FOREIGN PATENT DOCUMENTS

| | | |
|---|---|---|
| CN | 102037475 A | 4/2011 |
| EP | 0 513 856 A2 | 11/1992 |
| EP | 2 249 173 A1 | 11/2010 |
| EP | 2 264 799 A1 | 12/2010 |
| GB | 1 370 647 A | 10/1974 |
| JP | S61-067304 A | 4/1986 |
| JP | S62-172769 A | 7/1987 |
| JP | S62-172770 A | 7/1987 |
| JP | H06-265612 A | 9/1994 |
| JP | 2-924421 B2 | 7/1999 |
| JP | H11-266153 A | 9/1999 |
| JP | 2001-345488 A | 12/2001 |
| JP | 2004-080129 A | 3/2004 |
| JP | 2006-344761 A | 12/2006 |
| JP | 2012-109652 A | 6/2012 |
| JP | 2013-004717 A | 1/2013 |
| JP | 2014-503890 A | 2/2014 |
| JP | 2016-541146 A | 12/2016 |
| RU | 2 106 717 C1 | 3/1998 |
| RU | 2 212 671 C1 | 9/2003 |
| RU | 2010 124 198 A | 12/2011 |
| WO | WO 2017/065856 A1 | 4/2017 |

OTHER PUBLICATIONS

Mrrahimi et al., A new Paradigm for Universal Quantum Computation, New Journal of Physics, Dec. 2013 (Year: 2013).*

Didier, Nicholas: Thesis, The Josephson Effect In Superconductors and Quantum Gases, Nov. 24, 2009, Chapter 4, section 4.3 (Year: 2009).*

Matthew Reed, Doctoral Thessis, Yale Univ, May 2013, Entanglement and Quantum Error correction with Superconducting Qubits. (Year: 2013).*

(56) References Cited

OTHER PUBLICATIONS

Partial Supplementary European Search Report for Application No. EP 14854592.4 dated Mar. 29, 2017.
Extended European Search Report for European Application No. EP 14854592.4 dated Aug. 10, 2017.
International Search Report and Written Opinion for International Application No. PCT/US2014/060694 dated Apr. 2, 2015.
International Preliminary Report on Patentability for International Application No. PCT/US2014/060694 dated Apr. 28, 2016.
Extended European Search Report for European Application No. EP 16756465.7 dated Sep. 28, 2018.
International Search Report and Written Opinion for International Application No. PCT/US2016/019821 dated May 6, 2016.
International Preliminary Report on Patentability for International Application No. PCT/US2016/019821 dated Sep. 8, 2017.
Extended European Search Report for European Application No. EP 16756463.2 dated Sep. 7, 2018.
International Search Report and Written Opinion for International Application No. PCT/US2016/019819 dated May 3, 2016.
International Preliminary Report on Patentability for International Application No. PCT/US2016/019819 dated Sep. 8, 2017.
Extended European Search Report for European Application No. 16780864.1, dated Mar. 5, 2019.
Invitation to Pay Additional Fees for International Application No. PCT/US2016/027817 dated Jun. 3, 2016.
International Search Report and Written Opinion for International Application No. PCT/US2016/027817 dated Aug. 22, 2016.
International Preliminary Report on Patentability for International Application No. PCT/US2016/027817 dated Oct. 26, 2017.
International Search Report and Written Opinion for International Application No. PCT/US2017/013426 dated Apr. 5, 2017.
International Preliminary Report on Patentability for International Application No. PCT/US2017/013426 dated Jul. 26, 2018.
International Search Report and Written Opinion for International Application No. PCT/US2018/064922, dated Mar. 8, 2019.
Abdo et al., Full coherent frequency conversion between two propagating microwave modes. Phys Rev Lett. Apr. 26, 2013;110:173902.1-5. doi: 10.1103/PhysRevLett. 110.173902.
Abdo et al., Josephson amplifier for qubit readout. Appl Phys Lett. 2011; 99(16): 162506. doi: 10.1063/1.3653473.
Abdo et al., Josephson directional amplifier for quantum measurement of superconducting circuits. Phys Rev Lett. Apr. 25, 2014; 112:167701.1-5. doi: 10.1103/PhysRevLett. 112.167701.
Abdo et al., Nondegenerate three-wave mixing with the Josephson ring modulator. Phys Rev B. Jan. 16, 2013;87(1):014508.1-18. doi: 10.1103/PhysRevB.87.014508.
Albert et al., Holonomic quantum computing with cat-codes. Apr. 15, 2015. arXiv:1503.00194v2. 5 pages.
Albert et al., Symmetries and conserved quantities in Lindblad master equations. Phys Rev A. Feb. 2014;89(2):022118. arXiv:1310. 1523v2. 15 pages.
Araujo et al., A LEKID-based CMB instrument design for large-scale observations in Greenland. Proc of SPIE—The International Society for Optical Engineering. Aug. 4, 2014;9153:91530W. doi: 10.1117/12.2056828.
Barends et al., Minimizing quasiparticle generation from stray infrared light in superconducting quantum circuits, Appl Phys Lett. Sep. 13, 2011;99(11):113507.
Bergeal et al., Analog information processing at the quantum limit with a Josephson ring modulator. Nat Phys. Apr. 2010;6(4):296-302. doi: 10.1038/NPHYS1516. Epub Feb. 14, 2010. 7 pages.
Bergeal et al., Phase-preserving amplification near the quantum limit with a Josephson ring modulator. Nature. May 2010;465(7294):64-8. arXiv:0912.3407v1. 20 pages.
Bergeal et al., Phase-preserving amplification near the quantum limit with a Josephson ring modulator. Nature. 2010;465:64-9.
Bockstiegel et al., Development of broadband NbTiN traveling wave parametric amplifier for MKID readout. J Low Temp Phys. 2014;176:476-82.
Burgarth et al., Non-Abelian phases from quantum Zeno dynamics. Phys Rev A. Oct. 9, 2013;88:042107.1-5. doi: 10.1103/PhysRevA. 88.042107.
Campagne-Ibarcq et al., Observing quantum state diffusion by heterodyne detection of fluorescence. Phys Rev X. 2016;6:011002.
Campagne-Ibarcq et al., Persistent control of a superconducting qubit by stroboscopic measurement feedback. Phys Rev X. 2013;3:1-7. arXiv: 1301.6095v2.
Carollo et al., Coherent Quantum Evolution via Reservoir Driven Holonomy. Phys Rev Lett. Jan. 18, 2006;96;020403. arXiv:quant-ph/0507229v2. 4 pages.
Carollo et al., Geometric Phase Induced by a Cyclically Evolving Squeezed Vacuum Reservoir. Phys Rev Lett. Apr. 21, 2006;96:150403. arXiv:quant-ph/0507101v2. 5 pages.
Castellanos-Beltran et al., Amplification and squeezing of quantum noise with a tunable Josephson metamaterial. Nat Phys. Dec. 2008;4(12):928-31.
Castellanos-Beltran et al., Widely tunable parametric amplifier based on a superconducting quantum interference device array resonator. Applied Physics Letters. 2007;91(8). 4 pages.
Catelani et al., Relaxation and frequency shifts induced by quasiparticles in superconducting qubits, Phys Rev B. 2011;84(6) 064517.
Caves, Quantum limits on noise in linear amplifiers. Phys. Rev. D. 1982;26(8): 1817-39.
Chaturvedi et al., Berry's phase for coherent states. J Phys A: Math Gen. 1987;20(16):L1071-5.
Corcoles et al., Protecting superconducting qubits from radiation. App Phys Lett. 2011;99(18):181906.
Court et al., Quantitative study of quasiparticle traps using the single-Cooper-pair transistor. Phys Rev B. 2008;77(10): 100501.
Dasgupta et al., Decoherence-induced geometric phase in a multi-level atomic system. J Phys B: At Mol Opt Phys. Apr. 18, 2007;40(9):S127. arXiv:quant-ph/0612201v1. 10 pages.
De Lange et al., Reversing quantum trajectories with analog feedback. Phys Rev Lett. 2014;112:080501.
De Ponte et al., Relaxation- and decoherence-free subspaces in networks of weakly and strongly coupled resonators. Ann Phys. Mar. 12, 2007;322:2077-84.
Devoret et al., Superconducting Circuits for Quantum Information: An Outlook. Science. Mar. 8, 2013;339:1169-74. doi: 10.1126/science.1231930.
Dolan, Offset masks for lift-off photoprocessing. App Phys Lett. 1977;31(5):337-9.
Duan et al., Preserving Coherence in Quantum Computation by Pairing Quantum Bits. Phys Rev Lett. Sep. 8, 1997;79(10-8): 1953-6.
Eichler et al., Controlling the dynamic range of a Josephson parametric amplifier. EPJ Quantum Tech. Jan. 29, 2014;1(2). doi:10. 1140/epjqt2. 19 pages.
Facchi et al., Quantum Zeno Subspaces. Phys Rev Lett. Aug. 19, 2002;89(8):080401.1-4.
Flurin et al., Superconducting quantum node for entanglement and storage of microwave radiation. Phys Rev Lett. Mar. 6, 2015;114(9) :090503. Epub Mar. 4, 2015.
Flurin et al., Generating entangled microwave radiation over two transmission lines. Phys Rev Lett. Nov. 2, 2012; 109(18): 183901. Epub Oct. 31, 2012.
Frattini et al., 3-wave mixing Josephson dipole element. App Phys Lett. 2017;110:222603-4.
Friedrich et al., Experimental quasiparticle dynamics in a superconducting, imaging x-ray spectrometer, App Phys Lett. 1997;71(26):3901.
Golubov et al., Quasiparticle lifetimes and tunneling times in a superconductor-insulator-superconductor tunnel junction with spatially inhomogeneous electrodes. Phys Rev B Condens Matter. May 1, 1994;49(18):12953-68.
Gueron, Quasiparticles in a diffusive conductor: interaction and pairing, Universite Pierre et Marie Curie—Paris VI. 1997, 241 pages.
Hatridge et al., Dispersive magnetometry with a quantum limited SQUID parametric amplifier. Phys Rev B. Apr. 2011;83(13): 134501-1-8.

(56) References Cited

OTHER PUBLICATIONS

Hatridge et al., Quantum back-action of an individual variable-strength measurement. Science. Jan. 11, 2013; 339(6116): 178-81. doi: 10.1126/science.1226897.
Heeres et al., Cavity State Manipulation Using Photon-Number Selective Phase Gates. Phys Rev Lett. Sep. 25, 2015; 115:137002. 1-5. doi: 10.1103/PhysRevLett.115.137002.
Ho Eom et al., A wideband, low-noise superconducting amplifier with high dynamic range. Nature Physics. 2012;8(8):623-7.
Hofheinz et al., Synthesizing arbitrary quantum states in a superconducting resonator. Nature. May 28, 2009;459:546-9. doi:10.1038/nature08005. Supplementary Information. 6 pages.
Houck et al., Life after charge noise: recent results with transmon qubits. Quantum Info Process. Feb. 11, 2009;8(2-3): 105-15.
Hover et al., High fidelity qubit readout with the superconducting lowinductance undulatory galvanometer microwave amplifier. Appl Phys Lett. 2014;104;152601.1-4.
Hover et al., Superconducting Low-inductance Undulatory Galvanometer Microwave Amplifier. Appl Phys Lett. Feb. 7, 2012;100:063503.1-3.
Johnson et al., Dispersive readout of a flux qubit at the single photon level. Phys Rev B. 2011;84:220503. arXiv:1109.2858v2. 5 pages.
Kamal et al., Gain, directionality, and noise in microwave SQUID amplifiers: Input-output approach. Phys Rev B. 2012;86:144510.1-12. doi: 10.1103/PhysRevB.86.144510.
Kamal et al., Noiseless nonreciprocity in a parametric active device. Nature Physics. 2011;7:311-315.
Kamal et al., Signal-to-pump back action and self-oscillation in double-pump Josephson parametric amplifier. Phys. Rev. B. May 13, 2009;79:184301.
Kerckhoff et al., On-chip superconducting microwave circulator from synthetic rotation. Phys Rev Appl. 2015;4:034002. arXiv: 1502.06041. Submitted Feb. 21, 2015. 13 pages.
Kirchmair et al., Observation of quantum state collapse and revival due to the single-photon Kerr effect. Nature. Mar. 14, 2013;495:205-9. doi:10.1038/nature11902.
Knill et al., Theory of Quantum Error Correction for General Noise. Phys Rev Lett. Mar. 13, 2000;84(11):2525-8. arXiv:quant-ph/9908066v1. 6 pages.
Koch et al., Time-reversal symmetry breaking in circuit-QED based photon lattices. arXiv:1006.0762v2. Oct. 11, 2010. 19 pages.
Krastanov et al., Universal Control of an Oscillator with Dispersive Coupling to a Qubit. Phys Rev A. 2015;92:040303. arXiv: 1502.08015. Submitted Feb. 27, 2015. 5 pages.
Lähteenmäki et al., Advanced Concepts in Josephson Junction Reflection Amplifiers. Journal of Low Temperature Physics. 2014;175(5-6):868-76.
Leghtas et al., Confining the state of light to a quantum manifold by engineered two-photon loss. Dec. 16, 2014. arXiv: 1412.4633v1. 29 pages.
Lidar et al., Decoherence Free Subspaces for Quantum Computation. Phys Rev Lett. Sep. 21, 1998;81(12):2594-7. arXiv:quant-ph/9807004v2. 4 pages.
Lindblad, On the generators of quantum dynamical semigroups. Commun Math Phys. 1976;48(2):119-30.
Liu et al., Comparing and combining measurement-based and driven-dissipative entanglement stabilization. Phys. Rev. X. 2016;6:011022.
Macleod et al., Periodicity in Al/Ti superconducting single electron transistors. App Phys Lett. Aug. 3, 2009;95:052503.
Martinis et al., Calculation of Tc in a normal-superconductor bilayer using the microscopic-based Usadel theory. Nucl Instrum Methods Phys Res A. 2000;444(1)2:23-27.
Martinis et al., Energy decay in superconducting Josephson-Junction qubits from nonequilibrium quasiparticle excitations. Phys Rev Lett. 2009;103(9):097002.
Metelmann et al., Nonreciprocal photon transmission and amplification via reservoir engineering. Phys. Rev. X. 2015(5):021025.
Minev et al., Planar Superconducting Whispering Gallery Mode Resonators. Appl Phys Lett. Oct. 3, 2013;103:142604.1-3. doi: 10.1063/1.4824201.
Mirrahimi et al., Dynamically protected cat-qubits: a new paradigm for universal quantum computation. New J Phys. Apr. 22, 2014; 16:045014. 31 pages.
Mousolou et al., Universal non-adiabatic holonomic gates in quantum dots and single-molecule magnets. New J Phys. Jan. 17, 2014;16:013029. 10 pages.
Mück et al., Superconducting Quantum Interference Device as a Near-Quantum-Limited Amplifier at 0.5 GHz. Appl Phys Lett. Feb. 12, 2001;78(7):967-9. doi: 10.1063/1.1347384.
Murch et al., Observing single quantum trajectories of a superconducting quantum bit. Nature. Oct. 10, 2013;502(7470):211-4. doi: 10.1038/nature12539.
Mutus et al., Design and characterization of a lumped element single-ended superconducting microwave parametric amplifier with on-chip flux bias line. App Phys Lett. Sep. 17, 2013; 103:122602.
Narla et al., Robust concurrent remote entanglement between two superconducting qubits. Phys RevX. 2016;6:031036.
Narla et al., Wireless Josephson amplifier. Appl Phys Lett. 2014; 104:232605. doi: 10.1063/1.4883373. 6 pages.
Nsanzineza et al., Trapping a single vortex and reducing quasiparticles in a superconducting resonator. Phys Rev Lett. Sep. 12, 2014; 113(11): 117002. Epub Sep. 12, 2014.
O'Brien et al., Resonant Phase Matching of Josephson Junction Traveling Wave Parametric Amplifiers. Phys Rev Lett. Oct. 10, 2014; 113:157001.1-5.
Ofek et al., Demonstrating quantum error correction that extends the lifetime of quantum information. Nature. 2016;536:441-445.
Oreshkov et al., Adiabatic Markovian Dynamics. Phys Rev Lett. Jul. 30, 2010;105(5):050503. arXiv:1002.2219v4. 7 pages.
Oreshkov et al., Fault-Tolerant Holonomic Quantum Computation. Phys Rev Lett. Feb. 20, 2009;102:070502.1-4.
Oreshkov, Holonomic Quantum Computation in Subsystems. Phys Rev Lett. Aug. 28, 2009;103(9):090502. arXiv:0905.1249v3. 5 pages.
Pachos et al., Decoherence-free dynamical and geometrical entangling phase gates. Phys Rev A. 2004;69:033817. arXiv:quant-ph/0309180v3. 10 pages.
Paik et al., Observation of High Coherence in Josephson Junction Qubits Measured in a Three-Dimensional Circuit QED Architecture. Phys Rev Lett. Dec. 5, 2011;107(24):240501. arXiv:1105.4652v4. 5 pages.
Paz-Silva et al., Zeno Effect for Quantum Computation and Control. Phys Rev Lett. Feb. 24, 2012;108(8):080501. arXiv:1104.5507v2. 7 pages.
Peltonen et al., Magnetic-field-induced stabilization of nonequilibrium superconductivity in a normal- metal/insulator/superconductor junction. Phys Rev B. 2011;84(22):220502.
Pillet et al., Optimal design for the Josephson mixer. Mar. 30, 2015. arXiv:1503.08185v1. 5 pages.
Pillet, Amplification, entanglement and storage of microwave radiation using superconducting circuits. University of Virginia. Seminar. 2014;1-78.
Platenberg, Coupled superconducting flux qubits. Delft University of Technology. Thesis. 2007. 153 pages.
Pop et al., Coherent suppression of electromagnetic dissipation due to superconducting quasiparticles. Nature. Apr. 17, 2014;508(7496):369-72. doi: 10.1038/nature13017.
Ranzani et al., Graph-based analysis of nonreciprocity in coupled-mode systems. New J Phys. Oct. 15, 2014;17:023024. arXiv 2014;1406.4922v2. 21 pages.
Rigetti et al., Superconducting qubit in a waveguide cavity with a coherence time approaching 0.1 ms. Phys Rev B. 2012;86:100506.
Ristè et al., Feedback Control of a Solid-State Qubit Using High-Fidelity Projective Measurement. Phys Rev Lett. Dec. 2012;109(24):240502. arXiv: 1207.2944vl [cond-mat.mes-hall]. 9 pages.
Ristè et al., Millisecond charge-parity fluctuations and induced decoherence in a superconducting transmon qubit. Nat Commun. 2013;4:1913. doi: 10.1038/ncomms2936.

(56) References Cited

OTHER PUBLICATIONS

Roch et al., Observation of measurement-induced entanglement and quantum trajectories of remote superconducting qubits. Phys Rev Lett. May 2, 2014; 112:170501.1-5.
Roch et al., Widely Tunable, Non-degenerate Three-Wave Mixing Microwave Device Operating near the Quantum Limit. Phys Rev Lett. Apr. 2012;108(14):147701. arXiv: 1202.1315v1 [cond-mat.mes-hall], 5 pages.
Sarandy et al., Abelian and non-Abelian geometric phases in adiabatic open quantum systems. Phys Rev A. Jun. 2006;73(6):062101. arXiv:quant-ph/0507012v3. 10 pages.
Schackert et al., A Practical Quantum-Limited Parametric Amplifier Based on the Josephson Ring Modulator. A Dissertation Presented to the Faculty of the Graduate School of Yale University in Candidacy for the Degree of Doctor of Philosophy. Dec. 2013.
Schackert et al., Phase-preserving amplification near the quantum limit with a Josephson ring modulator. Nature. May 2010;465(7294):64-8. arXiv:0912.3407v1. 20 pages.
Schindler et al., Quantum simulation of open-system dynamical maps with trapped ions. Nature Phys. May 19, 2013;9:361-7. arXiv:1212.2418v1. 28 pages.
Segall et al., Dynamics and energy distribution of nonequilibrium quasiparticles in superconducting tunnel junctions. Physical Review B. 2004;70(21):214520.
Shankar et al., Autonomously stabilized entanglement between two superconducting quantum bits. Nature. Dec. 19, 2013;504(7480):419-22. doi:10.1038/nature12802. Epub Nov. 24, 2013.
Shaw et al., Kinetics of nonequilibrium quasiparticle tunneling in superconducting charge qubits. Phys Rev B. Jul. 1, 2008;78:024503.
Siddiqi et al., An RF-Driven Josephson Bifurcation Amplifier for Quantum Measurements. Phys Rev Lett. Nov. 10, 2004;93:207002. arXiv:cond-mat/0312623v1. 4 pages.
Silveri et al., Theory of remote entaglement via quantum limited phase-preserving amplification. Phys Rev A. Jun. 7, 2016;93:062310.
Sirois et al., Coherent-state storage and retrieval between superconducting cavities using parametric frequency conversion. Appl Phys Lett. Apr. 30, 2015;106:172603.
Sjöqvist, Trends: A new phase in quantum computation. Phys. 2008;1:35. doi: 10.1103/Physics.1.35. 6 pages.
Sliwa et al., Reconfigurable Josephson Circulator/Directional Amplifier. Phys. Rev. X 2015;5:041020.
Smith et al., Low noise papametric amplifier. IEEE Transactions on Magnetics. Mar. 1985;MAG-21(2):1022-8.
Spietz et al., Input Impedance and Gain of a Gigahertz Amplifier Using a DC SQUID in a Quarter Wave Resonator. Appl Phys Lett. Jun. 17, 2008;93:082506. arXiv:0806.2853v1. 4 pages.
Sun et al., Measurements of Quasiparticle Tunneling Dynamics in a Band-Gap-Engineered Transmon Qubit. Phys Rev Lett. Jun. 8, 2012;108:230509. doi: 10.1103/PhysRevLett.108.230509.
Sun et al., Tracking photon jumps with repeated quantum non-demolition parity measurements. Nature. Jul. 24, 2014;511(7510):444-8. doi: 10.1038/nature13436. Epub Jul. 13, 2014.
Swenson et al., High-speed phonon imaging using frequency-multiplexed kinetic inductance detectors,. App Phys Lett. Jul. 1, 2010; 96:263511.
Usadel, Generalized Diffusion Equation for Superconducting Alloys. Phys Rev Lett. 1970;25(8):507.
Vijay et al., Invited Review Article: The Josephson bifurcation amplifier. Rev Sci Instrum. Nov. 17, 2009;80:111101. doi: 10.1063/1.3224703.
Vijay et al., Observation of Quantum Jumps in a Superconducting Artificial Atom. Phys Rev Lett. Mar. 18, 2011;106(11):110502.1-4.
Vijay et al., Quantum feedback control of a superconducting qubit: Persistent Rabi oscillations. Nature. Oct. 4, 2012;490(7418):77-80. doi: 10.1038/nature11505.
Vion et al., Manipulating the quantum state of an electrical circuit. Science. May 3, 2002;296(5569):886-9.
Visser et al., Fluctuations in the electron system of a superconductor exposed to a photon flux. Nat Commun. 2014;5:3130. doi: 10.1038/ncomms4130.
Vool et al., Non-Poissonian quantum jumps of a fluxonium qubit due to quasiparticle excitations. Phys Rev Lett. Dec. 12, 2014;113(24):247001. Epub Dec. 8, 2014.
Wang et al., A Schrddiner cat living in two boxes. Science. May 27, 2016;352(6289):1087.
Wang et al., Measurement and control of quasiparticle dynamics in a superconducting qubit, Nature Comms. Dec. 18, 2014; 5:5836. doi:10.1038/ncomms6836.
Wang, Memristors and Superconducting Quantum Interference Filters in RF Systems. Department of Electrical and Computer Engineering, Duke University. Thesis. Aug. 18, 2014. 119 pages.
Wendin et al., Superconducting quantum circuits, qubits and computing. arXiv:cond-mat/0508729v1. Aug. 30, 2005. 60 pages.
Wenner et al., Excitation of superconducting qubits from hot nonequilibrium quasiparticles. Phys Rev Lett. Apr. 12, 2013; 110(15):150502. Epub Apr. 9, 2013.
Wu et al., Time-dependent decoherence-free subspace. J Phys A: Math. Theor. Sep. 19, 2012;45(40):405305. arXiv:1205.1298v2. 7 pages.
Xu et al., Non-Adiabatic Holonomic Quantum Computation in Decoherence-Free Subspaces. Phys Rev Lett. Oct. 24, 2012;109(17): 170501. arXiv:1210.6782v1. 4 pages.
Xu et al., Universal Nonadiabatic Geometric Gates in Two-Qubit Decoherence-Free Subspaces. Sci Rep. Oct. 29, 2014;4:6814. doi: 10.1038/srep06814. 5 pages.
Yaakobi et al., Parametric amplification in Josephson junction embedded transmission lines. Phys Rev B. Apr. 1, 2013;87:144301. 1-9. doi: 10.1103/PhysRevB.87.144301.
Yamamoto et al., Flux-driven Josephson parametric amplifier. Appl Phys Lett Jul. 2008;93:042510. doi:10.1063/1.2964182.
Zanardi et al., Coherent quantum dynamics in steady-state manifolds of strongly dissipative systems. Phys Rev Lett. Dec. 17, 2014;113:240406. arXiv: 1404.4673. 6 pages.
Zanardi et al., Geometry, robustness, and emerging unitarity in dissipation-projected dynamics. Phys Rev A. 2015;91:052324. arXiv: 1412.6198. 8 pages.
Zanardi et al., Holonomic Quantum Computation. Phys Lett A. Nov. 15, 1999;264:94-9. 5 pages.
Zanardi et al., Noiseless Quantum Codes. Phys Rev Lett. Oct. 27, 1997;79(17):3306-9. arXiv:quant-ph/9705044v2. 4 pages.
Zanardi, Stabilizing Quantum Information. Phys Rev A. Dec. 5, 2000;63(1):012301. arXiv:quant-ph/9910016v2. 5 pages.
Zanardi, Virtual Quantum Subsystems. Phys Rev Lett. Aug. 13, 2001;87(7):077901. arXiv:quant-ph/0103030v2. 4 pages.
Zhang et al., Physical implementation of holonomic quantum computation in decoherence-free subspaces with trapped ions. Phys Rev A. 2006;74:034302. arXiv:quant-ph/0608068v1. 4 pages.
Zheng, Dissipation-induced geometric phase for an atom in cavity QED. Phys Rev A. May 10, 2012;85(5):052106. arXiv: 1205.0984v2. 7 pages.
Zheng, Open-system geometric phase based on system-reservoir joint state evolution. Phys Rev A. Jun. 27, 2014;89:062118. arXiv: 1405.1227v1. 8 pages.
Zhong et al., Squeezing with a flux-driven Josephson parametric amplifier. New J Phys. Dec. 2013;15:125013. doi:10.1088/1367-2630/15/12/125013.
Zhou et al., High-gain weakly nonlinear flux-modulated Josephson parametric amplifier using a SQUID array. Physical Review. 2014;89(21). 6 pages.
Zhu et al., Geometric quantum gates robust against stochastic control errors. Phys Rev A. Aug. 15, 2005;72(2):020301. arXiv:quant-ph/0407177v1. 4 pages.
Zorin, Josephson Traveling-Wave Parametric Amplifier with Three-Wave Mixing. Phys Rev Applied. Sep. 12, 2016;6:034006.
Zueco et al., Qubit-oscillator dynamics in the dispersive regime: analytical theory beyond the rotating-wave approximation. Physical Review A 80.3 2009. 6 pages.
Extended European Search Report for European Application No. 17739044.0, dated Jul. 19, 2019.

(56) References Cited

OTHER PUBLICATIONS

Bianchetti et al., Dynamics of dispersive single qubit read-out in circuit quantum electrodynamics. Phys. Rev. A. Oct. 30, 2009;80:043840.
Govenius et al., Parity of measurement of remote qubits using dispersive coupling and photodetection. Phys. Rev. A. Oct. 1, 2015;92(4):042305.
Shafer, Balanced Amplifier IP3 Improvement. Wayback Machine archive of RF Café, first saved Dec. 5, 2008. https://web.archive.org/web/20081205031826/www.rfcafe.com/references/electrical/balanced-amplifier-ip3-improvement.htm, 2 pages.
EP17739044.0, Jul. 19, 2019, Extended European Search Report.
U.S. Appl. No. 15/029,666, filed Apr. 15, 2016, Abdo et al.
U.S. Appl. No. 16/160,897, filed Oct. 15, 2018, Abdo et al.
U.S. Appl. No. 15/553,030, filed Aug. 23, 2017, Szöcs et al.
U.S. Appl. No. 15/553,041, filed Aug. 23, 2017, Sliwa et al.
U.S. Appl. No. 15/567,198, filed Oct. 17, 2017, Sliwa et al.
EP 14854592.4, Mar. 29, 2017, Partial Supplementary European Search Report.
EP 14854592.4, Aug. 10, 2017, Extended European Search Report.
PCT/US2014/060694, Apr. 2, 2015, International Search Report and Written Opinion.
PCT/US2014/060694, Apr. 28, 2016, International Preliminary Report on Patentability.
EP 16756465.7, Sep. 28, 2018, Extended European Search Report.
PCT/US2016/019821, May 6, 2016, International Search Report and Written Opinion.
PCT/US2016/019821, Sep. 8, 2017, International Preliminary Report on Patentability.
EP 16756463.2, Sep. 7, 2018, Extended European Search Report.
PCT/US2016/019819, May 3, 2016, International Search Report and Written Opinion.
PCT/US2016/019819, Sep. 8, 2017, International Preliminary Report on Patentability.
EP16780864.1, Mar. 5, 2019, Extended European Search Report.
PCT/US2016/027817, Jun. 3, 2016, Invitation to Pay Additional Fees.
PCT/US2016/027817, Aug. 22, 2016, International Search Report and Written Opinion.
PCT/US2016/027817, Oct. 26, 2017, International Preliminary Report on Patentability.
PCT/US2017/013426, Apr. 5, 2017, International Search Report and Written Opinion.
PCT/US2017/013426, Jul. 26, 2018, International Preliminary Report on Patentability.
PCT/US2018/064922, Mar. 8, 2019, International Search Report and Written Opinion.
International Preliminary Report on Patentability for International Application No. PCT/US2018/064922, dated Jun. 25, 2020.
U.S. Appl. No. 16/770,942, filed Jun. 8, 2020, Frattini et al.
PCT/US2018/064922, Jun. 25, 2020, International Preliminary Report on Patentability.
U.S. Appl. No. 15/029,666, filed Apr. 15, 2016, Abo et al.
U.S. Appl. No. 16/160,897, file Oct. 15, 2018, Abdo et al.
U.S. Appl. No. 15/914,995, filed Mar. 7, 2018, Narla et al.
U.S. Appl. No. 15/567,198, filed Oct. 17, 2017, Silwa et al
Gan et al., Research on the Measurement for Quantum State of Microwave Single Photon in Superconducted Josephson Junction. Journal of Lanzhou University of Arts and Science (Natural Science Edition). Jan. 10, 2015:29(1):22-4, 28.

* cited by examiner

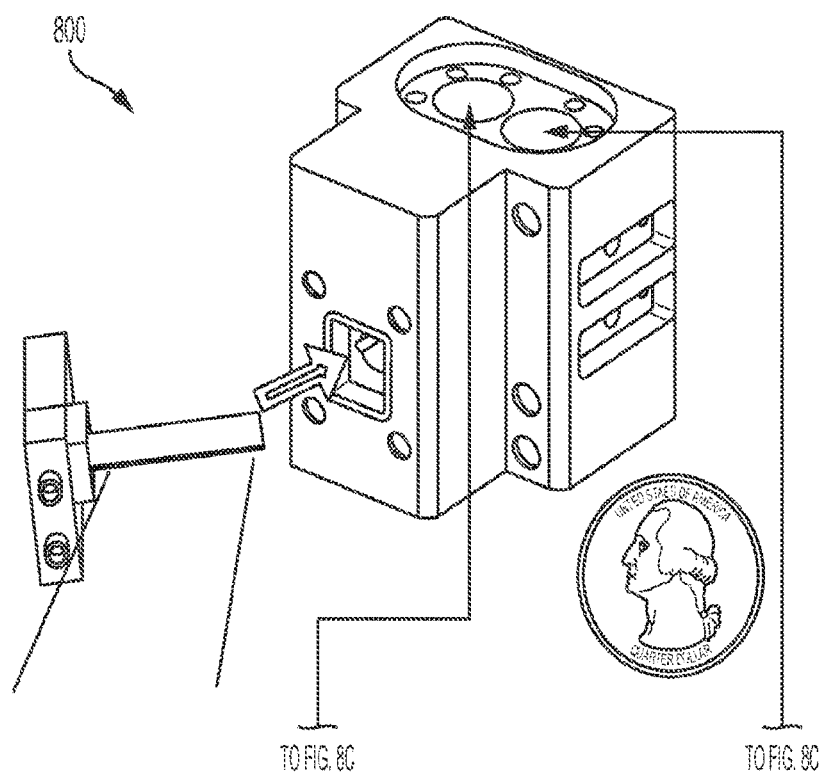
FIG. 8A
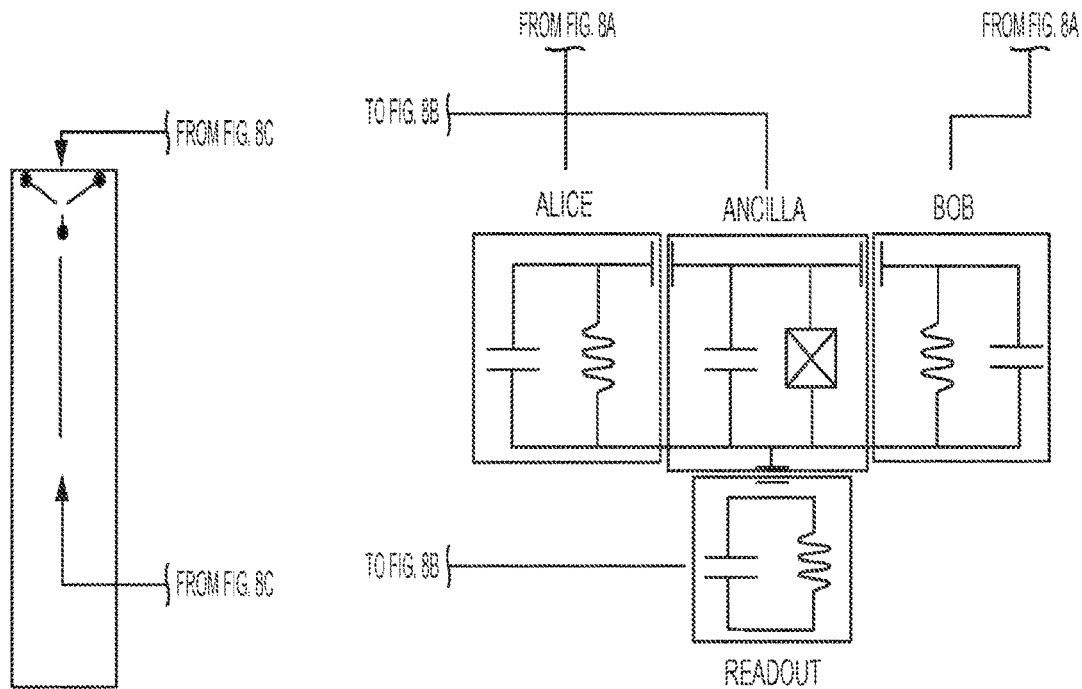
FIG. 8B
FIG. 8C

TECHNIQUES FOR MANIPULATION OF TWO-QUBIT QUANTUM STATES AND RELATED SYSTEMS AND METHODS

CROSS-REFERENCE TO RELATED APPLICATIONS

This Application is a national stage filing under 35 U.S.C. § 371 of International Patent Application No. PCT/US2017/013426, filed Jan. 13, 2017, entitled "TECHNIQUES FOR MANIPULATION OF TWO-QUBIT QUANTUM STATES AND RELATED SYSTEMS AND METHODS", which claims priority to U.S. Provisional Patent Application No. 62/335,591, filed May 12, 2016, entitled "METHODS AND APPARATUS FOR MANIPULATION OF MULTI-CAVITY QUANTUM STATES" and to U.S. Provisional Patent Application No. 62/279,624, filed Jan. 15, 2016, entitled "METHODS AND APPARATUS FOR MANIPULATION OF MULTI-CAVITY QUANTUM STATES," each of which is incorporated herein by reference to the maximum extent allowable.

GOVERNMENT FUNDING

This invention was made with government support under W911NF-14-1-0011 awarded by United States Army Research Office. The government has certain rights in the invention.

BACKGROUND

The ability to prepare and control the quantum state of a quantum system is important for quantum information processing. Just as a classical computer memory should have the ability to initialize bits and implement gates to change the state of a bit from zero to one and vice versa, a quantum computer should be able to initialize the state of the quantum system used to store quantum information and the quantum system should be able to be controlled to implement logical gates that change the quantum state of the quantum system.

Quantum information may be stored in any of a variety of quantum mechanical systems. Conventionally, quantum information may be stored using quantum bits, referred to as "qubits," which are typically two-state quantum mechanical systems. However, many-state quantum systems, such as quantum mechanical oscillators, may also be used to store quantum information.

SUMMARY

According to some aspects, a method is provided of operating a system that includes a multi-level quantum system dispersively coupled to a first quantum mechanical oscillator and dispersively coupled to a second quantum mechanical oscillator, the method comprising applying a first drive waveform to the multi-level quantum system, applying one or more second drive waveforms to the first quantum mechanical oscillator, and applying one or more third drive waveforms to the second quantum mechanical oscillator.

According to some embodiments, the first quantum mechanical oscillator implements a first logical qubit, the second quantum mechanical oscillator implements a second logical qubit, and the first drive waveform, one or more second drive waveforms and one or more third drive waveforms are together configured to perform a quantum logic gate between the first logical qubit and the second logical qubit.

According to some embodiments, the multi-level quantum system is a nonlinear quantum system.

According to some embodiments, the first drive waveform is configured to produce a superposition of states of the multi-level quantum system, the one or more second drive waveforms are configured to coherently add or remove energy to or from the first quantum mechanical oscillator conditional on a state of the multi-level quantum system, and the one or more third drive waveforms are configured to coherently add or remove energy to or from the second quantum mechanical oscillator conditional on the state of the multi-level quantum system.

According to some embodiments, the state of the multi-level quantum system is a superposition of a ground state and a first excited state.

According to some embodiments, the one or more second drive waveforms and one or more third drive waveforms are configured to coherently add or remove energy conditional on whether the multi-level quantum system is in the ground state or in the first excited state.

According to some embodiments, the one or more second drive waveforms consist of a single drive waveform with a bandwidth smaller than a dispersive frequency shift of the first quantum mechanical oscillator associated with a transition between the ground state and first excited state of the multi-level quantum system.

According to some embodiments, applying the one or more second drive waveforms comprises applying an initial drive waveform to the first quantum mechanical oscillator that coherently adds or removes energy to or from the first quantum mechanical oscillator, waiting for a predetermined time subsequent to application of the initial drive waveform, and applying a subsequent drive waveform to the first quantum mechanical oscillator that coherently adds or removes energy to or from the first quantum mechanical oscillator.

According to some embodiments, prior to application of the first drive waveform, the multi-level quantum system, first quantum mechanical oscillator, and second quantum mechanical oscillator are in respective ground states.

According to some embodiments, the method further comprises applying a fourth drive waveform to the multi-level quantum system, the fourth drive waveform configured to change the state of the multi-level system conditional on states of the first and second quantum mechanical oscillators.

According to some embodiments, the method further comprises measuring joint parity of the first quantum mechanical oscillator and second quantum mechanical oscillator.

According to some embodiments, measuring joint parity of the first quantum mechanical oscillator and second quantum mechanical oscillator comprises applying a fifth drive waveform to the multi-level quantum system, waiting for a first predetermined time subsequent to application of the fifth drive waveform, applying a sixth drive waveform to the multi-level quantum system, waiting for a second predetermined time subsequent to application of the sixth drive waveform, and applying a seventh drive waveform to the multi-level quantum system.

According to some embodiments, the method further comprises measuring a state of the multi-level quantum system via a readout resonator coupled to the multi-level quantum system.

According to some embodiments, the readout resonator is capacitively coupled to the multi-level quantum system and the readout resonator is further coupled to a transmission line.

According to some embodiments, measuring the state of the multi-level quantum system via the readout resonator comprises measuring an amplitude and a phase of a signal output from the readout resonator.

According to some embodiments, where is a dispersive frequency shift of the first quantum mechanical oscillator associated with a transition between a ground state of the multi-level quantum system and a first excited state of the multi-level quantum system, and where is a dispersive frequency shift of the second quantum mechanical oscillator associated with a transition between the ground state of the multi-level quantum system and the first excited state of the multi-level quantum system.

According to some embodiments, the multi-level quantum system is a superconducting transmon.

According to some embodiments, the first quantum mechanical oscillator and second quantum mechanical oscillator are resonator cavities.

According to some aspects, a circuit quantum electrodynamics system is provided, comprising a multi-level quantum system, a first quantum mechanical oscillator dispersively coupled to the multi-level quantum system, a second quantum mechanical oscillator dispersively coupled to the multi-level quantum system, and at least one electromagnetic radiation source configured to apply independent electromagnetic pulses to the multi-level quantum system, to the first quantum mechanical oscillator, and to the second quantum mechanical oscillator.

According to some embodiments, the at least one electromagnetic radiation source is configured to apply a first drive waveform to the multi-level quantum system, the first drive waveform configured to produce a superposition of states of the multi-level quantum system, apply one or more second drive waveforms to the first quantum mechanical oscillator, the one or more second drive waveforms configured to coherently add or remove energy to or from the first quantum mechanical oscillator conditional on a state of the multi-level quantum system, and apply one or more third drive waveforms to the second quantum mechanical oscillator, the one or more third drive waveforms configured to coherently add or remove energy to or from the second quantum mechanical oscillator conditional on the state of the multi-level quantum system.

According to some embodiments, the multi-level quantum system is a nonlinear quantum system.

According to some embodiments, the multi-level quantum system is a nonlinear quantum system comprising a Josephson junction comprising a first superconducting portion, a second superconducting portion, and an insulating portion, the first superconducting portion and the second superconducting portion are physically separated by the insulating portion, a first antenna electrically connected to the first superconducting portion, a second antenna electrically connected to the first superconducting portion, and a third antenna electrically connected to the second superconducting portion.

According to some embodiments, the first quantum mechanical oscillator is dispersively coupled to the nonlinear quantum system via the first antenna, and the second quantum mechanical oscillator is dispersively coupled to the nonlinear quantum system via the second antenna.

According to some embodiments, the multi-level quantum system is a superconducting transmon.

According to some embodiments, the first quantum mechanical oscillator and second quantum mechanical oscillator are resonator cavities.

According to some embodiments, the system further comprises a stripline readout resonator capacitively coupled to the multi-level quantum system.

According to some embodiments, at least one of the first drive waveform, the one or more second drive waveforms, and the one or more third drive waveforms are produced by a field programmable gate array (FPGA).

According to some aspects, a nonlinear quantum device is provided comprising a Josephson junction comprising a first superconducting portion, a second superconducting portion, and an insulating portion, the first superconducting portion and the second superconducting portion are physically separated by the insulating portion, a first antenna electrically connected to the first superconducting portion, a second antenna electrically connected to the first superconducting portion, and a third antenna electrically connected to the second superconducting portion.

According to some embodiments, the first antenna, the second antenna and the first superconducting portion intersect at a single location.

According to some embodiments, the nonlinear quantum device further comprises a metallic strip capacitively coupled to the third antenna.

The foregoing apparatus and method embodiments may be implemented with any suitable combination of aspects, features, and acts described above or in further detail below. These and other aspects, embodiments, and features of the present teachings can be more fully understood from the following description in conjunction with the accompanying drawings.

BRIEF DESCRIPTION OF DRAWINGS

Various aspects and embodiments will be described with reference to the following figures. It should be appreciated that the figures are not necessarily drawn to scale. In the drawings, each identical or nearly identical component that is illustrated in various figures is represented by a like numeral. For purposes of clarity, not every component may be labeled in every drawing.

FIG. 8A is a photograph of a machined aluminum package containing two coaxial stub cavity resonators and a transmon, suitable for practicing aspects of the present disclosure;

FIG. 8B is a micrograph image of the transmon of the device of FIG. 8A; and

FIG. 8C is a schematic effective circuit of the device of FIG. 8A.

DETAILED DESCRIPTION

Figure 1:
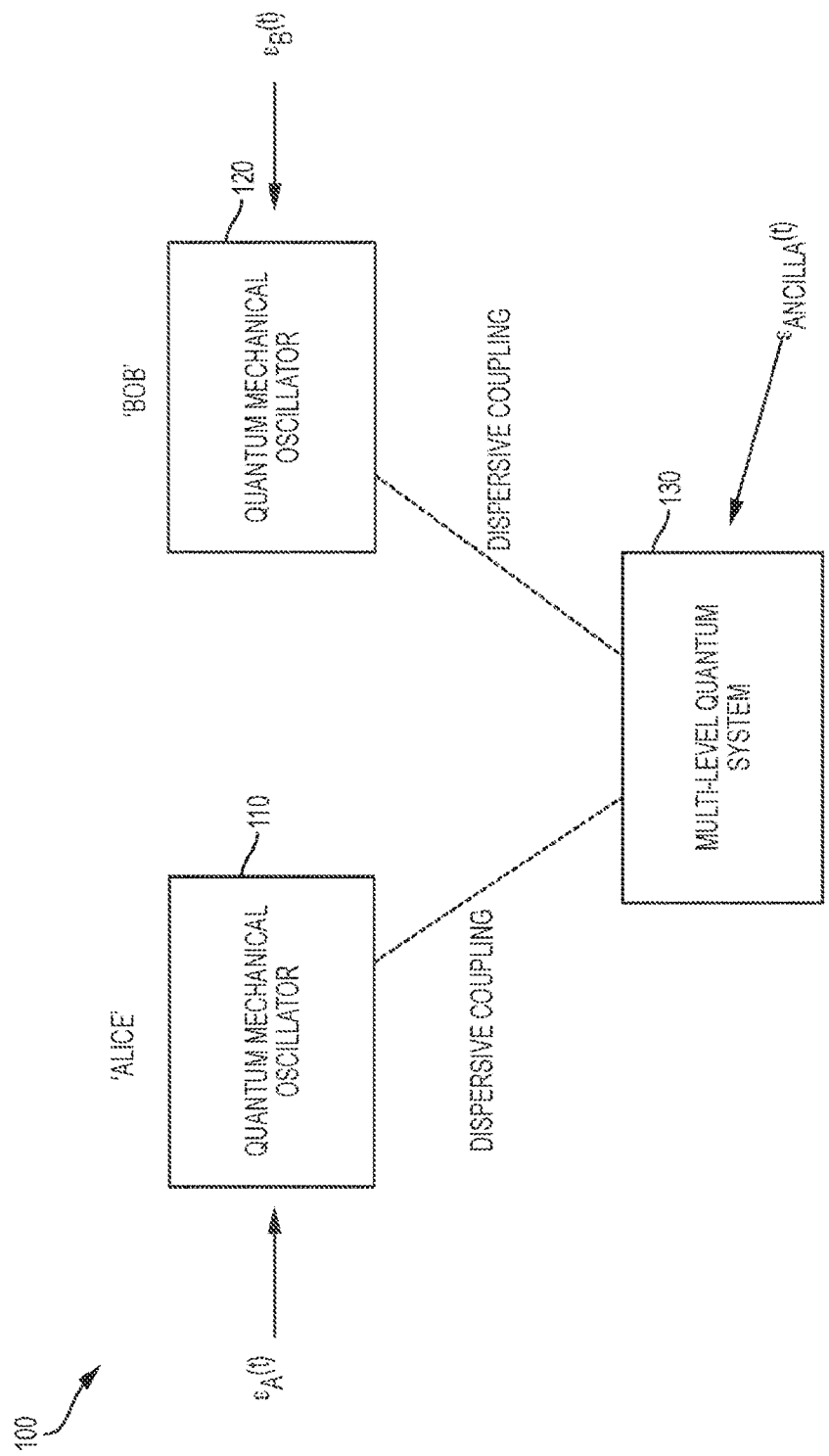
FIG. 1 is a block diagram of a circuit quantum electrodynamics system suitable for practicing aspects of the present disclosure.

Developing a quantum computer involves a number of different technical developments, some of which build upon each other. As an initial step, a quantum system must be developed that can be controlled sufficiently well to hold one bit of quantum information (a 'qubit') long enough for the qubit to be written, manipulated, and read. Once this has been achieved, quantum algorithms can be performed on these quantum systems if a number of additional requirements, known as the DiVincenzo criteria, are also satisfied. One of these criteria is the ability to implement a universal set of gates. That is, to implement gates that in combination can realize complex quantum algorithms. Unlike in classical computing, however, in which any desired Boolean gate can be implemented from NAND (or NOR) gates alone, in a quantum computer universality can only be achieved with a combination of arbitrary single qubit gates and a two-qubit gate (e.g., a CNOT gate).

Another of the DiVincenzo criteria is to produce qubits that have sufficiently long decoherence times to be able to perform computation. Some techniques to help meet this criteria employ quantum error correction techniques to correct decoherence errors in a quantum system once they occur. If the error correction operations are sufficiently effective, the state of a quantum system can be maintained for a long time, and possibly indefinitely.

The inventors have recognized and appreciated techniques for implementing a universal set of quantum logic gates in a system that satisfies the DiVincenzo criteria. Quantum information may be stored in linear quantum mechanical oscillators that are coupled to one another by a multi-level (e.g., nonlinear) quantum system. The states of the linear quantum mechanical oscillators act a logical qubit for storing a single bit of quantum information. By controlling the quantum mechanical oscillators and the multi-level quantum system with driving signals, a universal set of quantum logic gates can be implemented. For example, arbitrary single qubit rotations can be performed, as well as entangling and disentangling operations between two or more qubits.

These techniques comprise an operation for generating an entangled state between two quantum mechanical oscillators. Such a state may enable logical operations between two logical qubits, where each logical qubit is represented by a state of one of the oscillators, and may further enable quantum error correction techniques to be applied to these qubits. Accordingly, these techniques may support the two DiVincenzo criteria discussed above, by simultaneously (i) allowing logical operations to be performed upon two qubits, and by (ii) lengthening decoherence times by enabling quantum error correction techniques.

In some embodiments, a suitable device architecture may include a multi-level quantum system, such as a transmon or other nonlinear quantum system, dispersively coupled to two qubits each implemented as a quantum mechanical oscillator. The oscillators may be, for example, resonator cavities or other suitable linear quantum oscillators. The multi-level quantum system may be used as an ancilla to create, manipulate, and/or to measure the quantum states of each of the oscillators to which it is coupled. By accessing multiple energy levels of the ancilla, the techniques described herein make it possible to realize universal quantum control of the two qubits and to monitor the error syndrome of the two qubits by performing quantum nondemolition (QND) measurements.

A nonlinear quantum system is a quantum system that does not have an infinite number of energy levels (e.g., energy eigenstates) separated by a constant energy difference. In contrast, a linear quantum system has an infinite number of evenly distributed energy levels. An example of a linear quantum system is a quantum mechanical oscillator. An example of a nonlinear quantum system is a two-level quantum system (e.g., a two-level atom) which only has two energy eigenstates. Another example of a nonlinear quantum system is a multi-level quantum system such as a superconducting qubit (e.g., a transmon).

Conventionally, nonlinear quantum systems are used to store quantum information. For example, it has been shown that transmons can be used to implement a qubit. The inventors, however, have recognized and appreciated that storing quantum information in linear quantum mechanical oscillators has several advantages over storing the information in nonlinear quantum systems. One such advantage is an increase in coherence time. In particular, the inventors have recognized and appreciated that so-called "cat states" may be a particularly useful type of state of the quantum mechanical oscillators to which to apply the techniques described herein.

A cat state is a coherent superposition of two coherent states with opposite phase. For example, in a quantum harmonic oscillator a cat state can be described by $$\frac{1}{\sqrt{2}}(|\alpha\rangle + |-\alpha\rangle),$$

where $|\alpha\rangle$ is a coherent state with a first phase and $|-\alpha\rangle$ is a coherent state with a second phase that is shifted 180 degrees relative to the first phase. At large $|\alpha|$, the two components of the cat state correspond to distinct quasi-classical wave-packets, drawing analogy to Schrödinger's symbolic paradox of an unfortunate cat inside a closed box being simultaneously dead and alive. Cat states have so far been realized with single-mode optical or microwave fields with up to about 100 photons, but are increasingly susceptible to decoherence as the number state increases in magnitude.

According to some embodiments, an entangled state across two quantum mechanical oscillators may be produced by entangling cat states of the oscillators. Techniques for producing such a state are discussed below, but initially properties of the entangled state will be described. The entangled state may be expressed as:

$$|\psi_\pm\rangle = \frac{1}{\sqrt{2}}(|\alpha\rangle_A|\alpha\rangle_B \pm |-\alpha\rangle_A|-\alpha\rangle_B) \quad \text{(Eqn. 1)}$$

where $|\pm\alpha\rangle_A$ and $|\pm\alpha\rangle_B$ are coherent states of two oscillator eigenmodes whose amplitudes are prepared to be equal for convenience. The two oscillators are referred to herein as "Alice" and "Bob." Each of the two modes are predominantly localized in one of the two oscillators that are weakly connected via the ancilla.

Despite a nonzero (but small) spatial overlap of the two modes, for convenience we refer to the two modes herein as the states of the two oscillators. For larger $|\alpha|$ (e.g., $|\alpha|^2 \geq 2$), $|\psi_\pm\rangle$ can be considered a single cat state living in two boxes whose superposed components are coherent states in a hybridized mode involving both Alice and Bob. Alternatively, in the more natural eigenmode basis, $|\psi_\pm\rangle$ may also be understood as two single-oscillator cat states that are entangled with each other.

Multi-oscillator cat states can be a useful way of encoding quantum information that allows fault-tolerant quantum computation, where quantum information is redundantly encoded in the coherent state basis of the multiple oscillators. In this context, the techniques described herein realize an architecture of two coupled logical qubits. The two-mode cat state can be considered a two-qubit Bell state $$\frac{1}{\sqrt{2}}(|0\rangle|0\rangle \pm |1\rangle|1\rangle)$$

of the logical qubits, where the first quasi-orthogonal coherent states $|\alpha\rangle$ represents the logical state $|0\rangle$ for each of the two oscillators and the second quasi-othogonal coherent state $|-\alpha\rangle$ represents the logical state $|1\rangle$ for each of the two oscillators.

According to some embodiments, the quantum mechanical oscillators may be bosonic systems. In such cases, the two-mode cat state is an eigenstate of the joint boson number parity operator $P_J$:

$$P_J = P_A P_B = e^{i\pi a^\dagger a} e^{i\pi b^\dagger b} \quad \text{(Eqn. 2)}$$

where $a(a^\dagger)$ and $b(b^\dagger)$ are the annihilation (creation) operators of bosons in Alice and Bob, and $P_A$ and $P_B$ are the boson number parity operators on the individual oscillators. Remarkably, $|\psi_+\rangle$ (or $|\psi_-\rangle$) has definitively even (or odd) number of bosons in two cavities combined, while the boson number parity in each cavity is maximally uncertain. The error syndrome of the two-mode cat state may therefore be monitored by performing quantum non-demolition (QND) measurements of the cat state.

According to some embodiments, QND measurements of the joint parity may be performed by probing the two-mode cat state via the coupled ancilla. The results of such measurements, discussed below, are not only illustrative of the highly non-classical properties of the state, but also the fundamental tools for quantum error correction in general. According to some embodiments, the system may include a readout unit coupled to the ancilla (which is in turn coupled to each of the two quantum mechanical oscillators). The readout unit may be, for example, a resonating cavity that may be used to projectively measure the ancilla state. The readout unit may thereby provide for the above-mentioned QND measurements of the two oscillators, including but not limited to joint and/or single parity measurements of the oscillators.

Following below are more detailed descriptions of various concepts related to, and embodiments of, techniques for techniques for generating, manipulating and/or probing an entangled state across two quantum mechanical oscillators. It should be appreciated that various aspects described herein may be implemented in any of numerous ways. Examples of specific implementations are provided herein for illustrative purposes only. In addition, the various aspects described in the embodiments below may be used alone or in any combination, and are not limited to the combinations explicitly described herein.

FIG. 1 is a block diagram of a circuit quantum electrodynamics system suitable for practicing aspects of the present disclosure. System 100 includes quantum mechanical oscillators 110 ("Alice") and 120 ("Bob") dispersively coupled to a multi-level quantum system 130 ("ancilla"). An electromagnetic signal $\varepsilon_A(t)$ may be applied to the oscillator 110, an electromagnetic signal $\varepsilon_B(t)$ may be applied to the oscillator 120, and an electromagnetic signal $\varepsilon_{ancilla}(t)$ may be applied to the multi-level system 130. Generally in the discussion below, application of such an electromagnetic signal or pulse may also be referred to as "driving" of the oscillator or ancilla. In some embodiments, the multi-level quantum system 130 may be a nonlinear quantum system.

As discussed above, to manipulate the states of the two oscillators, the multi-level quantum system 130 may be used as an ancilla. One or more energy levels of the multi-level system may be accessed in this process. For instance, the lowest two energy levels, the lowest three energy levels, etc. or any other group of energy levels may be accessed by $\varepsilon_{ancilla}(t)$ to produce interactions between the ancilla and the two oscillators via the respective dispersive couplings, examples of which are described below.

According to some embodiments, the Hamiltonian of system 100 which includes two oscillator modes, a multi-level system, and their dispersive interactions can be written as:

$$H/\hbar = \omega_A a^\dagger a + \omega_B b^\dagger b + \omega_{ge}|e\rangle\langle e| + (\omega_{ge} + \omega_{ef})|f\rangle\langle f|$$
$$-\chi_A^{ge} a^\dagger a |e\rangle\langle e| - (\chi_A^{ge} + \chi_A^{ef}) a^\dagger a |f\rangle\langle f|$$
$$-\chi_B^{ge} b^\dagger b |e\rangle\langle e| - (\chi_B^{ge} + \chi_B^{ef}) b^\dagger b |f\rangle\langle f| \quad \text{(Eqn. 3)}$$

where $a(a^\dagger)$ and $b(b^\dagger)$ are the annihilation (creation) operators of energy quanta in the oscillators Alice and Bob, $|g\rangle$, $|e\rangle$ and $|f\rangle$ are the lowest three energy levels of the ancilla, $\omega_A$ and $\omega_B$ are the angular frequencies of the two oscillators (Alice and Bob), $\omega_{ge}$ and $\omega_{ef}$ are the $|e\rangle \to |g\rangle$ and $|f\rangle \to |e\rangle$ transition frequencies of the ancilla, and $\chi_i^{ge}$ and $\chi_i^{ef}$ (i=A or B) represent the dispersive frequency shifts of oscillator i associated with the two ancilla transitions. Small higher-order nonlinearities are neglected in Eqn. 1 for simplicity.

The time-dependent driving signals $\varepsilon_A(t)$, $\varepsilon_B(t)$ and $\varepsilon_{ancilla}(t)$, also referred to herein as "drive waveforms," may be applied to Alice, Bob and the ancilla, respectively, to realize arbitrary single qubit operations upon each of these elements. One illustrative approach to determining and applying these time-dependent drives is based on Optimal Control Theory (OCT) and is described in International Patent Application No. PCT/US16/43514, filed on Jul. 22, 2016, titled "Techniques of Oscillator State Manipulation for Quantum Information Processing and Related Systems and Methods," which is hereby incorporated by reference in its entirety. Other examples of apparatus and methods for applying control pulses to apply logic gates to and perform other manipulations on a coupled transmon/oscillator quibit system are described in U.S. Provisional Patent Application No. 62/294,966, filed on Feb. 12, 2016, titled "Quantum Computer State Controller," which is hereby incorporated by reference in its entirety. Such quantum logic gates between oscillator and ancilla states are the key tools for deterministic generation and manipulation of the two-mode cat state $|\psi_\pm\rangle$, for example, and for enabling continuous-variable-based quantum computation.

The inventors have recognized and appreciated a process for producing the two mode entangled cat state described above with respect to the two oscillators of system 100 that may be broadly described as follows. Initially, the multi-level quantum system 130 may be manipulated into a superposition of two energy levels. One approach to produce this result may be to drive the ancilla with $\varepsilon_{ancilla}(t)$ to produce a rotation of the ancilla state in the $|g\rangle - |e\rangle$ Bloch sphere. Irrespective of how the ancilla is arranged to be in this state, each oscillator may subsequently be driven by a displacement conditional on the state of the ancilla, which entangles each oscillator with the state of the ancilla. For instance, if the conditional displacement is applied with each oscillator in the $|0\rangle$ state and the displacement is conditional on the ancilla being in $|g\rangle$, the displacement realizes a three-way entangling gate:

$$\frac{1}{\sqrt{2}}(|g\rangle + |e\rangle)|0\rangle_A|0\rangle_B \rightarrow \frac{1}{\sqrt{2}}(|g\rangle|0\rangle_A|0\rangle_B + |e\rangle|2\alpha\rangle_A|2\alpha\rangle_B) \quad \text{(Eqn. 4)}$$

Subsequently, another rotation operation can be applied to the ancilla that is conditional on the joint oscillator state, which disentangles the ancilla and leaves the oscillators in a two-mode cat state.

According to some embodiments, the state-dependent frequency shifts ($\chi$'s) of each oscillator with respect to each ancilla transition are arranged to allow cavity state manipulations conditioned on the ancilla level, or vice versa, using spectrally-selective control pulses. In practice, such an arrangement comprises forming the oscillators and ancilla system to have different resonant frequencies that enabled such manipulations. An example of one such arrangement is discussed below.

Figure 2:
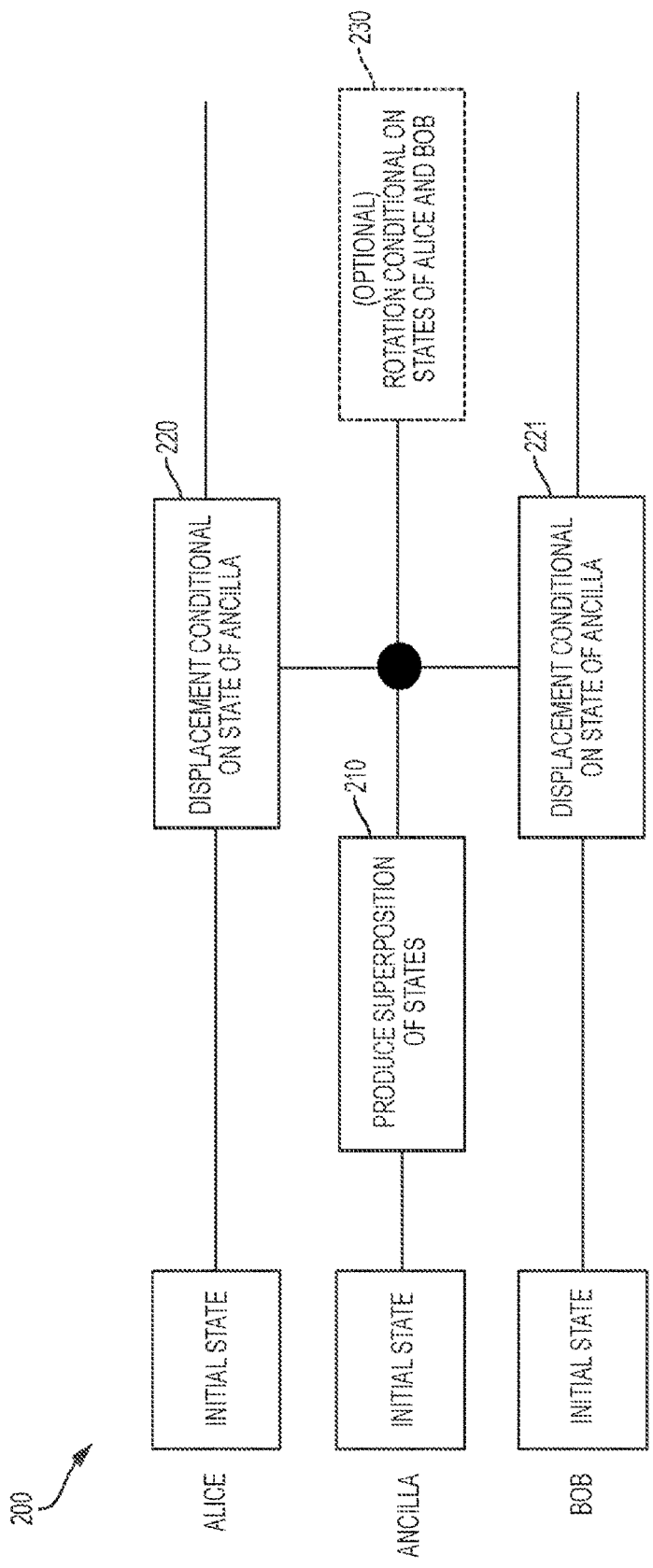
FIG. 2 illustrates a control sequence for producing cat states spanning modes of two quantum mechanical oscillators, according to some embodiments.

This above-described cat state entanglement process is illustrated in FIG. 2, which shows a control sequence for producing cat states spanning modes of two quantum mechanical oscillators, according to some embodiments. Control sequence 200 illustrates the states of Alice, Bob and the Ancilla system with time running left to right in the figure.

In illustrative control sequence 200, Alice, Bob and the Ancilla system begin in distinct initial states. In some embodiments, the three systems have initial states that are ground states of the respective systems. For instance, Alice and Bob may be in the $|0\rangle$ state and the ancilla may be in the $|g\rangle$ state. While these initial states may represent convenient starting points for the illustrated control sequence, other initial states may be contemplated so long as the described entanglement between cat states can be produced.

In act 210, the ancilla is controlled to be in a superposition of states. This may be achieved by driving the ancilla with a driving signal to cause a rotation of the quantum state of the ancilla on a Bloch sphere associated with two eigenstates of the ancilla. The superposition may be a superposition of any number of the energy levels of the multi-level ancilla system, and any superposition of these energy levels may be produced. The key steps in control sequence 200 are the conditional displacements 220 and 221, which are conditional on the state of the ancilla and produce entanglement between the ancilla and each of the two oscillators. So long as these displacements may be made conditional on states of the superposition of the ancilla produced in act 210 to produce such entanglement, any suitable superposition may be produced in act 210.

In acts 220 and 221, gates are applied to Alice and Bob, respectively, that coherently add (or remove) energy to (or from) the oscillator conditional on the state of the coupled ancilla. Since the ancilla is in a superposition of states at this stage, making the displacements 220 and 221 conditional on at least one of those states of the superposition produces a superposition of states in the respective oscillator that is entangled with the state of the ancilla.

In optional act 230, a rotation may be applied to the ancilla conditional on the states of Alice and Bob. This rotation may disentangle the ancilla from the oscillators, yet may leave the oscillators entangled with one another via their (weak) couplings through the ancilla.

Figure 3B:
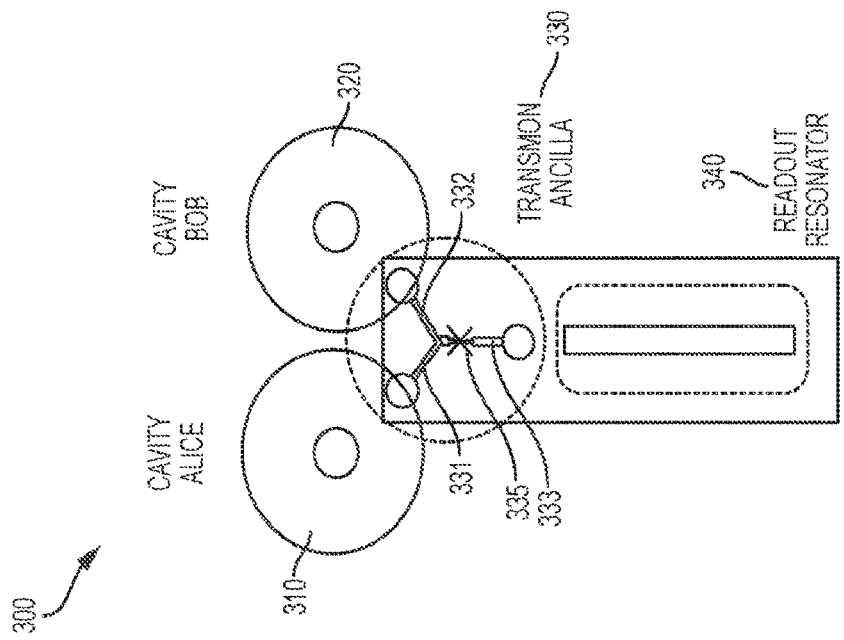
FIG. 3B is a top view of the system shown in FIG. 3A, according to some embodiments.
Figure 3A:
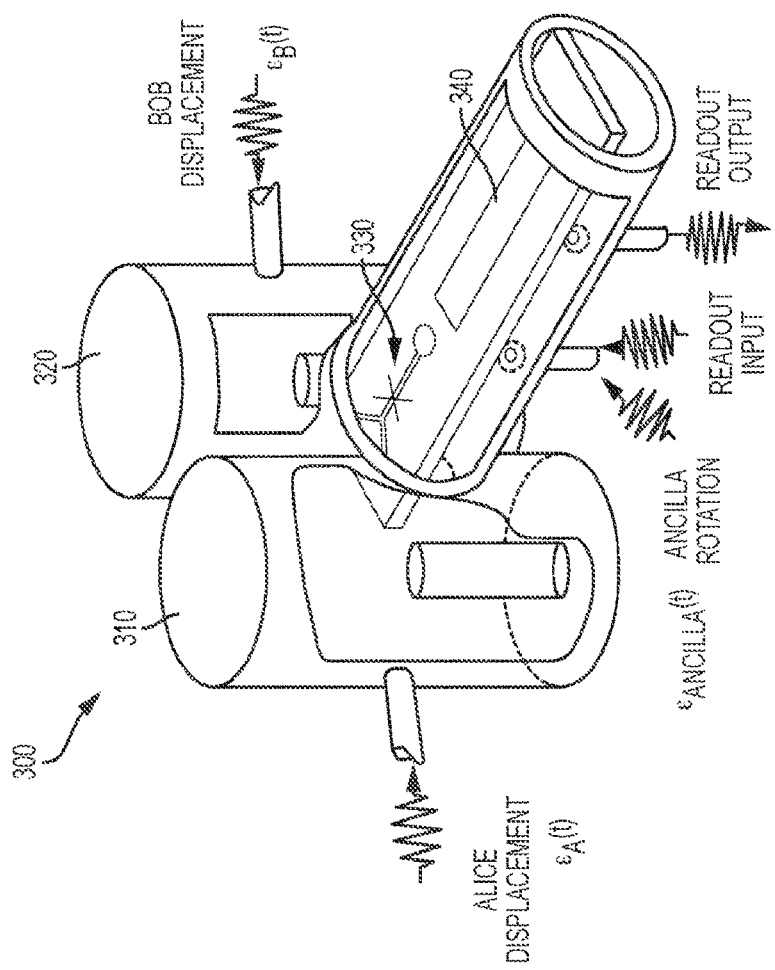
FIG. 3A is a three-dimensional schematic of an illustrative circuit quantum electrodynamics system comprising two coaxial resonator cavities and a readout resonator coupled to an ancilla transmon, according to some embodiments.

To illustrate one possible experimental realization of system 100 shown in FIG. 1, FIGS. 3A and 3B depict an illustrative circuit quantum electrodynamics (cQED) system comprising two coaxial resonator cavities coupled to an ancilla transmon, according to some embodiments. In system 300, which is a three-dimensional schematic of the device shown in FIG. 3A, resonators 310 and 320 function as quantum mechanical oscillators 110 and 120 in the system of FIG. 1, and transmon 330 functions as the multi-level quantum system 130 in the system of FIG. 1. The resonators 310 and 320, as illustrated, are coaxial cavities formed from aluminum.

In the example of FIGS. 3A-3B, the cQED system also includes a quasi-planar linear resonator that may be operated to readout the state of the ancilla transmon. The amplitude and phase of the pulse produced by the readout resonator near its resonance frequency both depend on the quantum state of the ancilla transmon. The resonator is formed by the resonator cavity shown in FIG. 3A and by the stripline on the transmon chip which is the central element of the coaxial arrangement shown. The transmon features three antennas 331, 332 and 333, which are coupled to the cavity 310, cavity 320 and readout resonator 340, respectively. Josephson junction 335 is coupled to each of the antennas.

Figure 4:
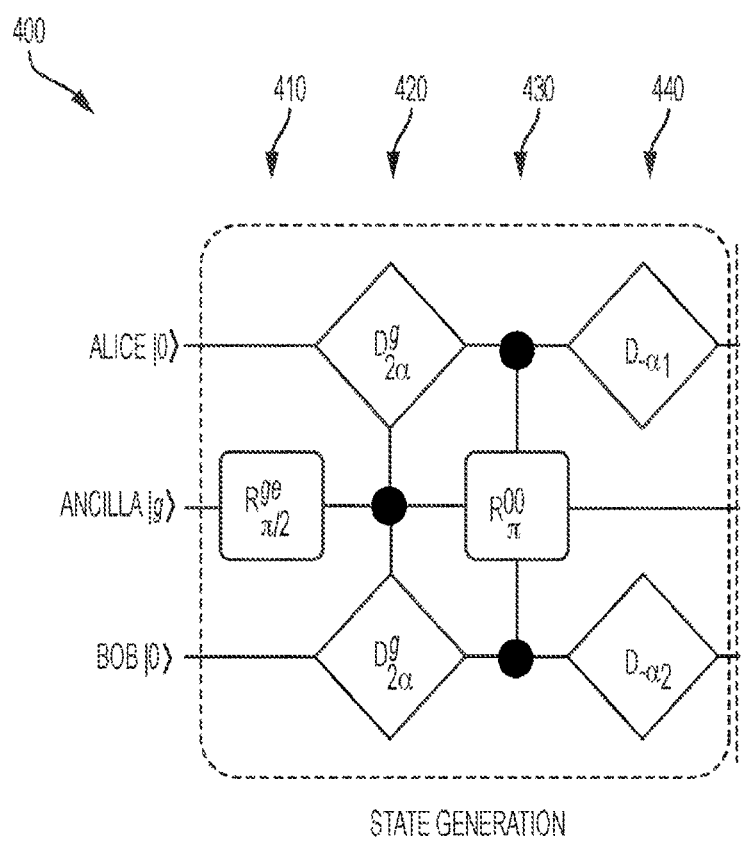
FIG. 4 illustrates an alternative control sequence suitable for producing cat states spanning modes of two quantum mechanical oscillators, according to some embodiments.
Figure 5:
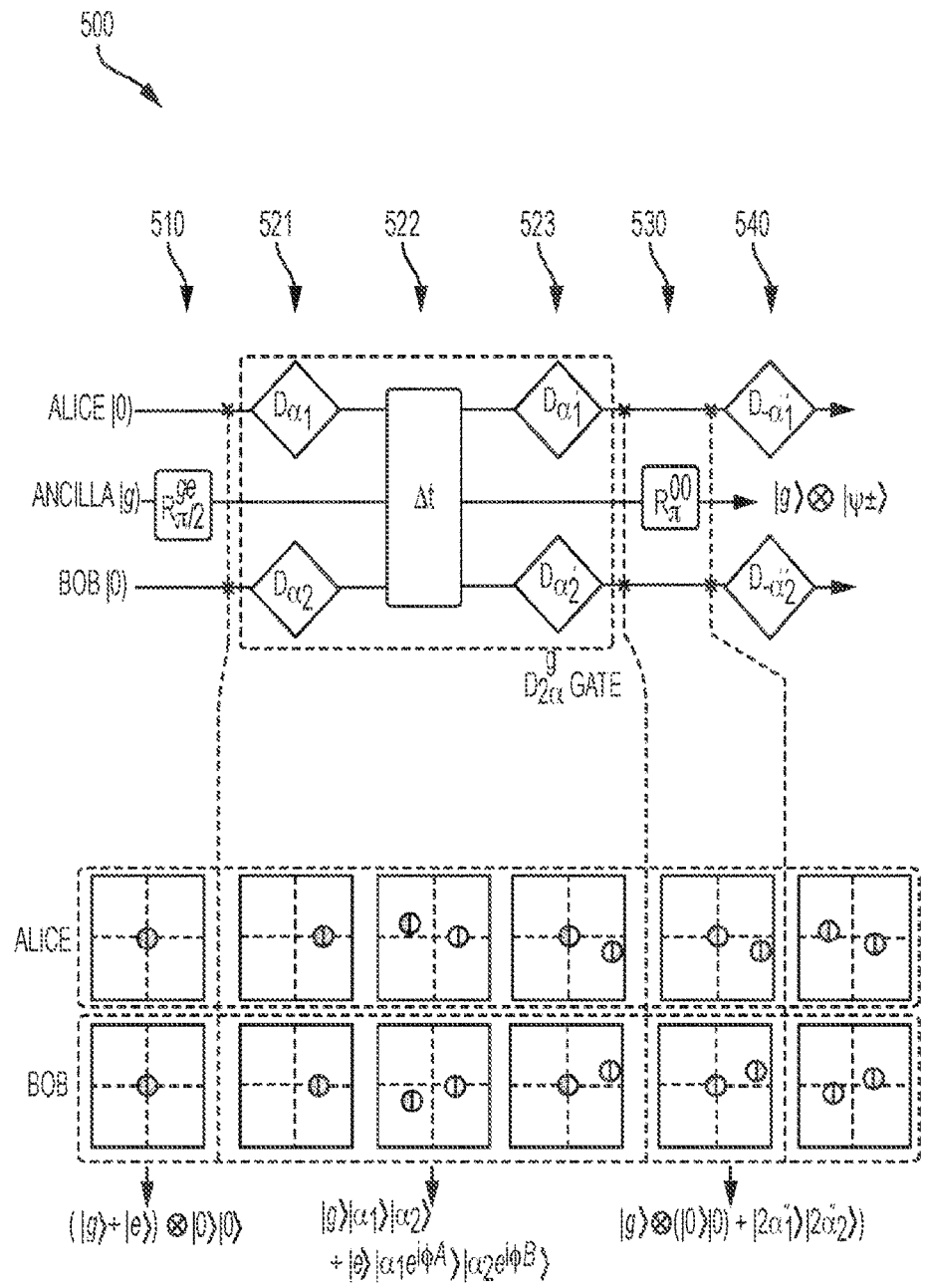
FIG. 5 illustrates a control sequence suitable for producing cat states spanning modes of two quantum mechanical oscillators in which conditional displacements upon the oscillators are each realized by two non-conditional displacements, according to some embodiments.
Figure 6A:
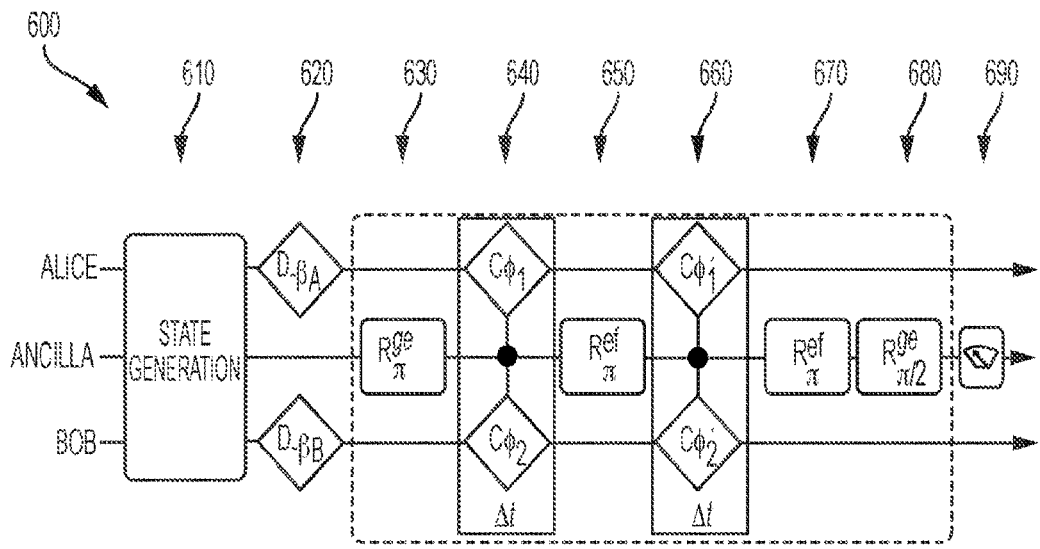
FIGS. 6A-6B are illustrative control sequences depicting two approaches to experimentally measuring the joint parity of two quantum mechanical oscillators, according to some embodiments.
Figure 6B:
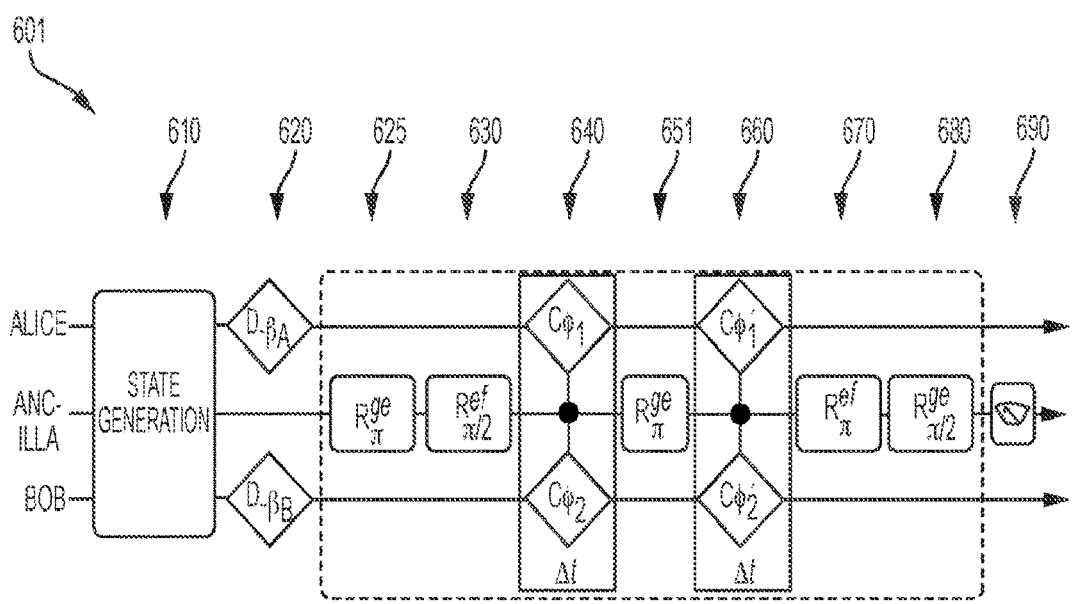
Figure 7:
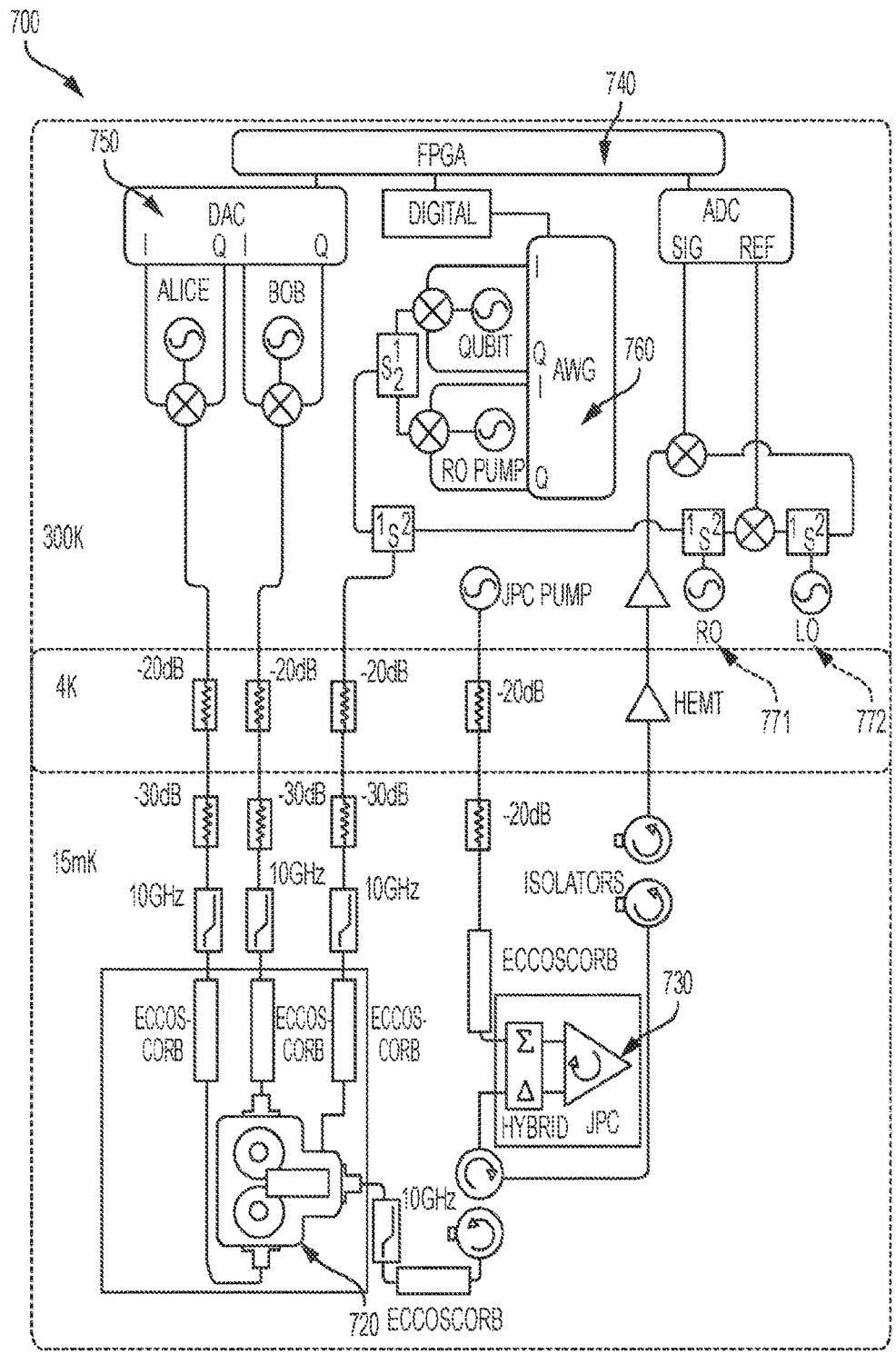
FIG. 7 is a circuit diagram of an illustrative experimental setup for controlling and/or measuring a system of two quantum mechanical oscillators coupled to an ancilla multi-level quantum system, according to some embodiments.

The illustrative cQED system 300 shown in FIGS. 3A-3B is explored in more detail below, with FIG. 4 depicting a specific control sequence for producing a two-mode cat state across the resonator cavities 310 and 320; FIG. 5 depicting an illustrative technique for effectively producing a conditional displacement on the resonator cavities by applying two non-conditional displacements with a waiting period in between; FIGS. 6A-6B depicting two illustrative control sequences for experimentally measuring the joint parity of the two resonator cavities; FIG. 7 illustrates an experimental setup for operation of system 300; and FIGS. 8A-8C depict a physical implementation of system 300 from a block of high-purity aluminum.

While many experimental implementations and configurations may be envisioned based on the type of cQED system shown in FIGS. 3A-3B, one illustrative configuration in terms of the properties of each resonator and the transmon will be described. Table 1 below shows the Hamiltonian parameters of each component of an illustrative embodiment of system 300, including the transmon ancilla, the two cavity resonators (Alice and Bob) and the readout resonator. The measured parameters include all transition frequencies ($\omega/2\pi$), dispersive shifts between each resonator and each transmon transition ($\chi/2\pi$), the self-Kerr of Alice ($K_A/2\pi$) and Bob ($K_B/2\pi$), and the cross-Kerr interaction between Alice and Bob ($K_{AB}/2\pi$). The Kerr parameters and $\chi_d^{ef}$ associated with the readout resonator are theoretical estimates based on the other measured parameters.

TABLE 1

| | Frequency $\omega/2\pi$ | Nonlinear Alice $X_A/2\pi$ | interactions Bob $X_B/2\pi$ | versus: Readout |
|---|---|---|---|---|
| $\|e\rangle \rightarrow \|g\rangle$ | 4.87805 GHz | 0.71 MHz | 1.41 MHz | 1.74 MHz |
| $\|f\rangle \rightarrow \|e\rangle$ | 4.76288 GHz | 1.54 MHz | 0.93 MHz | 1.63 MHz |
| Alice | 4.2196612 GHz | 0.83 kHz | −9 kHz | 5 kHz |
| Bob | 5.4467677 GHz | −9 kHz | 5.6 kHz | 12 kHz |
| Readout | 7.6970 GHz | 5 kHz | 12 kHz | 7 kHz |

In the example of Table 1, it will be noted that $\omega_A < \omega_{ef} < \omega_{ge} < \omega_B$. As discussed below in relation to FIGS. 6A-6B, this arrangement allows for measurements of the joint parity of the resonators without the requirement that $\chi_A^{ge}$ is exactly equal to $\chi_B^{ge}$.

FIG. 4 illustrates a control sequence suitable for producing cat states spanning modes of two quantum mechanical resonators, according to some embodiments. Control sequence 400 may be applied to system 300 shown in FIGS. 3A-3B, for example.

In the example of FIG. 4, resonators Alice and Bob and the Ancilla transmon, are initially in ground states $|0\rangle$ state and $|g\rangle$, respectively. In act 410, an ancilla superposition is prepared by performing a rotation $R_{\pi/2}^{ge}$ that is an ancilla rotation of $\pi/2$ in the X-Y plane of the Bloch sphere of the $|g\rangle - |e\rangle$ manifold. This places the ancilla in an equal superposition of the ground and excited states, $$\frac{1}{\sqrt{2}}(|g\rangle + |e\rangle).$$

In act 420, conditional displacements $D_{2\alpha}^g$ are applied to each of the two cavities. By applying the time-dependent microwave control pulses $\varepsilon_A(t)$ and $\varepsilon_B(t)$ to the cavities, arbitrary cavity state displacements may be produced in Alice ($D_{\beta_A} = e^{\beta_A a^\dagger - \beta_A^* a}$) and Bob ($D_{\beta_B} = e^{\beta_B b^\dagger - \beta_B^* b}$) independently. In the example of FIG. 4, the conditional displacements are operations that would put the respective resonators in the $|2\alpha\rangle$ state (add energy to move the state from $|0\rangle$ to $|2\alpha\rangle$) when the coupled ancilla transmon is in the $|g\rangle$ state. The net result of these displacements is to realize a three-way entangling gate:

$$\frac{1}{\sqrt{2}}(|g\rangle + |e\rangle)|0\rangle_A|0\rangle_B \rightarrow \frac{1}{\sqrt{2}}(|g\rangle|0\rangle_A|0\rangle_B + |e\rangle|2\alpha\rangle_A|2\alpha\rangle_B)$$

In act 430, an ancilla rotation ($R_\pi^{00}$) conditional on the cavity state $|0\rangle_A|0\rangle_B$ disentangles the ancilla and leaves the cavities in a two-mode cat state. That is, the ancilla returns to $|g\rangle$ yet the cavities remain in the $$\frac{1}{\sqrt{2}}(|0\rangle_A|0\rangle_B + |2\alpha\rangle_A|2\alpha\rangle_B)$$

state.

In act 440, additional displacements $D_{-\alpha}$ are applied to the cavities. These are unconditional displacements of Alice and Bob ($D_{-\alpha}$) to center the cat state in the phase space. This is a trivial step purely for the convenience of the presentation, and produces a cat state:

$$\frac{1}{\sqrt{2}}(|-\alpha\rangle_A|-\alpha\rangle_B + |\alpha\rangle_A|\alpha\rangle_B).$$

As discussed above, the conditional displacement ($D_{2\alpha}^g$) is what allows the entangling of the ancilla with the cavities, and therefore allows the generation of an entangled state between the two cavities. This operation can be directly implemented using cavity drives with a bandwidth smaller than the dispersive interaction strength ($\chi_i^{ge}$, i=A or B). However, this method requires a comparatively long pulse duration (and therefore higher infidelity due to decoherence and Kerr effects). An alternative method for producing the conditional displacement ($D_{2\alpha}^g$) is shown in FIG. 5.

FIG. 5 illustrates a control sequence in which the conditional displacement $D_{2\alpha}^g$ is effectively realized by two unconditional displacements separated by a wait time $\Delta t$ in between. In the example of FIG. 5, steps 510, 530 and 540 are equivalent to steps 410, 430 and 440 shown in FIG. 4. The difference between FIG. 4 and FIG. 5 is that steps 521, 522 and 523 together effectively implement step 420 in FIG. 4—that is, the conditional displacement $D_{2\alpha}^g$.

In step 521, non-conditional displacements $D_{\alpha_1}$ and $D_{\alpha_2}$ are applied to Alice and Bob, respectively, resulting in the product state of the two cavities being $|\alpha_1\rangle |\alpha_2\rangle$. In some embodiments, the two displacements may have equal magnitude and phase (e.g., $\alpha_1 = \alpha_2$). In step 522, a wait time $\Delta t$ is performed, during which time the states in Alice and Bob accumulate conditional phases that are dependent on the state of the ancilla, represented by the unitary operator U(t). Specifically, during the wait time $\Delta t$, due to the dispersive interactions between each cavity and the ancilla, cavity coherent states in both cavities accumulate conditional phases of $\phi_i = \chi_i^{ge} \Delta t$ if the ancilla is in $|e\rangle$:

$$U(\Delta t) = I_A \otimes I_B \otimes |g\rangle\langle g| + e^{i\phi_A a^\dagger a} \otimes e^{i\phi_B b^\dagger b} \otimes |e\rangle\langle e| \quad (\text{Eqn. 5})$$

The net result is that the states of the cavities evolve into a three-way entangled state in the manner:

$$\frac{1}{\sqrt{2}}(|g\rangle + |e\rangle)|\alpha_1\rangle|\alpha_2\rangle \rightarrow \frac{1}{\sqrt{2}}(|g\rangle|\alpha_1\rangle|\alpha_2\rangle + |e\rangle|\alpha_1 e^{i\phi_A}\rangle|\alpha_2 e^{i\phi_B}\rangle)$$

An additional displacement applied in act 523 to each cavity after this time evolution step effectively arrives at the same result as the conditional displacement described above. Using the IQ plane to describe the photon probability distribution in each cavity in the rotating frame, a coherent state $|\alpha'\rangle_i$ can be represented by a (Gaussian) circle that stays stationary when the ancilla is in $|g\rangle$, and rotates with the angular velocity $\chi_i^{ge}$ when the ancilla is in $|e\rangle$: $|\alpha'\rangle_i \rightarrow |\alpha' e^{i\chi_i^{ge} \Delta t}\rangle_i$. Therefore, this conditional phase gate can split cavity coherent state in the phase space when the ancilla is prepared in $$\frac{1}{\sqrt{2}}(|g\rangle + |e\rangle),$$

effectively realizing a conditional displacement.

FIGS. 6A-6B are illustrative control sequences depicting two approaches to experimentally measuring the joint parity of two quantum mechanical oscillators, according to some embodiments. As discussed above, measurement of joint parity number is important both to understand the two-mode cat state and to be able to detect error syndromes and correct them to maintain the state via quantum error correction techniques.

For the illustrative system 300 shown in FIGS. 3A-3B, the joint parity measurement is a joint photon number parity, $P_J$, measurement. This single-cavity photon parity measurements using only the only $|g\rangle$ and $|e\rangle$ levels of an ancilla qubit is applicable to one cavity when the other cavity is in the vacuum state. The measurement uses the dispersive interaction $\chi_i^{ge}$ to map even-photon-number and odd-photon-number states in the cavity of interest (i=A or B) to different levels of the ancilla. This may be realized by two $\pi/2$ rotations of the ancilla qubit, $R_{\pi/2}^{ge}$ (around the same axis, e.g., the X-axis), separated by a wait time of $\pi/\chi_i^{ge}$. For example, if Bob is in the vacuum state ($b^\dagger b|0\rangle = 0$), the conditional phase shift described in Eqn. 5 over the time $\Delta t = \pi/\chi_A^{ge}$ is described by the following unitary operator:

$$U(\pi/\chi_A^{ge}) = C_\pi^A = |\otimes|g\rangle\langle g| + e^{i\pi a^\dagger a}\otimes|e\rangle\langle e| \quad \text{(Eqn. 6)}$$

This shift is equivalent to a qubit Z-rotation of $\pi$ conditioned on the photon number in Alice being odd because $e^{i\pi a^\dagger a} = P_A$. Therefore the whole sequence $R_{\pi/2}^{ge} C_\pi^A R_{\pi/2}^{ge}$ flips the qubit if and only if the photon number parity in Alice is even, and therefore a subsequent readout of the qubit state measures the parity of the cavity.

This control and measurement sequence to measure parity in a single cavity can in principle be implemented to also measure the joint photon number parity, but only if $\chi_A^{ge}$ is exactly equal to $\chi_B^{ge}$. This is because for a wait time of $\Delta t = \pi/\chi_A^{ge}(=\pi/\chi_B^{ge})$, from Eqn. 5 we have:

$$U(\pi/\chi_i^{ge}) = C_\pi^A C_\pi^B = |\otimes|g\rangle\langle g| + P_A P_B \otimes|e\rangle\langle e| \quad \text{(Eqn. 7)}$$

Noting $P_J = P_A P_B$, an identical control sequence of $R_{\pi/2}^{ge} U(\Delta t) R_{\pi/2}^{ge}$ followed by a qubit readout would achieve the joint parity measurement. However, without strictly identical $\chi_A^{ge}$ and $\chi_B^{ge}$, the phase accumulation in one cavity is faster than the other, and it is in general not possible to realize parity operators in both cavities simultaneously using this simple protocol. Moreover, for a general two-cavity quantum state, this sequence cannot measure single-cavity parity operator ($P_A$ or $P_B$) due to inevitable entanglement between the ancilla and the photons in the other cavity during the process.

According to some embodiments, one technique for measuring $P_J$ with a less stringent requirement on Hamiltonian parameters works by exploiting the $|f\rangle$-level of the ancilla. This method is may be advantageous when $|e\rangle\to|g\rangle$ transition of the ancilla shows stronger interaction with Bob ($\chi_B^{ge} > \chi_A^{ge}$), while the $|f\rangle\to|e\rangle$ transition shows stronger interaction with Alice ($\chi_A^{ef} > \chi_B^{ef}$). This can be physically realized by engineering the ancilla frequency between the two cavities, i. e. $\omega_A < \omega_{ef} < \omega_{ge} < \omega_B$.

Considering the quantum state with two cavities and three ancilla levels in general, the unitary evolution for any wait time $\Delta t$ is:

$$U(\Delta t) = I_A \otimes I_B \otimes |g\rangle\langle g| + \quad \text{(Eqn. 8)}$$
$$e^{i\phi_A a^\dagger a} \otimes e^{i\phi_B b^\dagger b} \otimes |e\rangle\langle e| + e^{i\phi'_A a^\dagger a} \otimes e^{i\phi'_B b^\dagger b} \otimes |f\rangle\langle f|$$

where $$\phi_A = \chi_A^{ge}\Delta t, \phi_B = \chi_B^{ge}\Delta t$$
$$\phi'_A = \chi_A^{gf}\Delta t, \phi'_B = \chi_B^{gf}\Delta t \quad \text{(Eqn. 9)}$$

Here we define $\chi_A^{gf} \equiv \chi_A^{ge} + \chi_A^{ef}$ and $\chi_B^{gf} \equiv \chi_B^{ge} + \chi_B^{ef}$. Therefore, the two cavities simultaneously acquire conditional phases in their coherent state components at relative rates that differ for $|e\rangle$ and $|f\rangle$. FIGS. 6A and 6B illustrate two different pulse sequences for realizing a joint parity measurement without the requirement that $\chi_A^{ge}$ and $\chi_B^{ge}$ are equal. In both FIG. 6A and FIG. 6B, step 610 represents the generation of a state between two oscillators (Alice and Bob) and an ancilla. Step 610 may comprise, for instance, control sequence 200 shown in FIG. 2 or control sequence 400 shown in FIG. 4. Step 620 in each of FIG. 6A and FIG. 6B are initial displacements of the cavities.

In the example of FIG. 6A, for a given two-cavity quantum state $\Psi_{AB}$, we can first use a $R_{\pi/2}^{ge}$ rotation in act 630 to prepare the ancilla in the state $$\frac{1}{\sqrt{2}}(|g\rangle + |e\rangle).$$

Then, a wait time $\Delta t_1$ in act 640 imparts phases $\phi_{A1} = \chi_A^{ge}\Delta t_1$ and $\phi_{B1} = \chi_B^{ge}\Delta t_1$ to the two cavities for the $|e\rangle$ component of the state:

$$\Psi_{AB} \otimes \frac{1}{\sqrt{2}}(|g\rangle + |e\rangle) \quad \text{(Eqn. 10)}$$
$$\Rightarrow \frac{1}{\sqrt{2}}\left[\Psi_{AB} \otimes |g\rangle + e^{i\phi_{A1} a^\dagger a} e^{i\phi_{B1} b^\dagger b} \Psi_{AB}|e\rangle\right]$$

Next, in act 650 the $|e\rangle$ component in this intermediate state is converted to $|f\rangle$ by a $\pi$ rotation in the $|e\rangle - |f\rangle$ space, $R_\pi^{ef}$. Subsequently, a second wait time $\Delta t_2$ in act 660 leads to a second simultaneous conditional phase gate, imparting phases $\phi_{A2} = \chi_A^{gf}\Delta t_2$ and $\phi_{B2} = \chi_B^{gf}\Delta t_2$ to the two cavities for the now $|f\rangle$ component of the state:

$$\frac{1}{\sqrt{2}}\left[\Psi_{AB}\otimes|g\rangle + e^{i\phi_{A1} a^\dagger a}e^{i\phi_{B1} b^\dagger b}\Psi_{AB}\otimes|f\rangle\right] \Rightarrow \quad \text{(Eqn. 11)}$$
$$\frac{1}{\sqrt{2}}\left[\Psi_{AB}\otimes|g\rangle + e^{i(\phi_{A1}+\phi_{A2}) a^\dagger a}e^{i(\phi_{B1}+\phi_{B2}) b^\dagger b}\Psi_{AB}\otimes|f\rangle\right]$$

The $|f\rangle$ component is then converted back to $|e\rangle$ by another $R_\pi^{ef}$ pulse in act 670. When $\Delta t_1$ and $\Delta t_2$ satisfy the following equations:

$$\phi_{A1}+\phi_{A2} = \chi_A^{ge}\Delta t_1 + \chi_A^{gf}\Delta t_2 = \pi$$
$$\phi_{B1}+\phi_{B2} = \chi_B^{ge}\Delta t_1 + \chi_B^{gf}\Delta t_2 = \pi \quad \text{(Eqn. 12)}$$

the obtained quantum state is:

$$\frac{1}{\sqrt{2}}[\Psi_{AB}\otimes|g\rangle + P_J\Psi_{AB}\otimes|e\rangle] \quad \text{(Eqn. 13)}$$

effectively realizing the simultaneous controlled $\pi$-phase gate ($C_\pi^A C_\pi^B$) in Eqn. 7. Finally, a $R_{\pi/2}^{ge}$ pulse in act 680 completes the projection of joint parity to the ancilla $|g\rangle$, $|e\rangle$ levels, ready for readout through the readout resonator in act 690.

The condition for finding non-negative solutions for $\Delta t_1$ and $\Delta t_2$ in Eqn. 12 is that $\chi_A^{ge}-\chi_B^{ge}$ and $\chi_A^{gf}-\chi_B^{gf}$ have opposite signs. In essence, the cavity that acquires phase slower than the other at $|e\rangle$ due to smaller $\chi_i^{ge}$ is allowed to catch up at $|f\rangle$ using its larger $\chi_i^{gf}$.

It should be noted that such relative relation of $\chi$'s is just a practically preferred condition rather than an absolute mathematical requirement. This is because parity mapping can be achieved whenever both cavities acquire a conditional phase of $\pi$ modulo $2\pi$. It is always possible to allow extra multiples of $2\pi$ phases applied to the cavity with stronger dispersive coupling to the ancilla, although it increases the total gate time and incurs more decoherence. The most important ingredient in engineering the $P_J$ operator is the extra tuning parameter $\Delta t_2$ (in addition to $\Delta t_1$) that allows two equations such as Eqn. 12 to be simultaneously satisfied.

This extra degree of freedom also enables measurement of photon number parity of a single cavity, $P_A$ or $P_B$, for an arbitrary two-cavity quantum state. This alternative can be realized with the same control sequences as shown in FIG. 6A whilst choosing such wait times that one cavity acquires a conditional $\pi$ phase (modulo $2\pi$) while the other acquires 0 phase (modulo $2\pi$). For example, to measure $P_A$ we use $\Delta t_1$ and $\Delta t_2$ satisfying:

$$\phi_{A1}+\phi_{A2}=\chi_A^{ge}\Delta t_1+\chi_A^{gf}\Delta t_2=\pi(\text{mod } 2\pi)$$

$$\phi_{B1}+\phi_{B2}=\chi_B^{ge}\Delta t_1+\chi_B^{gf}\Delta t_2=\pi(\text{mod } 2\pi) \quad \text{(Eqn. 14)}$$

FIG. 6B shows this alternative version of joint parity mapping protocol, which uses more ancilla operations, but is more adaptive to a larger parameter space of $\chi$'s. In this protocol, the ancilla spends time at $|e\rangle - |f\rangle$ superposition, when conditional phases proportional to $\chi_i^{ef}$ are applied to the cavities. To achieve joint parity mapping, the two time intervals $\Delta t_1$ and $\Delta t_2$ therefore should satisfy:

$$\phi_{A1}+\phi_{A2}=\chi_A^{ef}\Delta t_1+\chi_A^{gf}\Delta t_2=\pi(\text{mod } 2\pi)$$

$$\phi_{B1}+\phi_{B2}=\chi_B^{ef}\Delta t_1+\chi_B^{gf}\Delta t_2=\pi(\text{mod } 2\pi) \quad \text{(Eqn. 15)}$$

which can avoid the use of extra $2\pi$ phases when $\chi_A^{ef}-\chi_B^{ef}$ has opposite sign versus $\chi_A^{gf}-\chi_B^{gf}$.

Experimentally, choices of which parity mapping sequence to apply (FIG. 6A or FIG. 6B) and gate times $\Delta t_1$ and $\Delta t_2$ involve trade-offs in various aspects such as pulse speed/bandwidth and coherence time. For the sequence of FIG. 6A, $\Delta t_1=0$, $\Delta t_2=184$ ns has been experimentally implemented. For the sequence of FIG. 6B, $\Delta t_1=28$ ns, $\Delta t_2=168$ ns has been experimentally implemented. The actual effective wait time is longer due to the non-zero duration (16 ns) of each ancilla rotation. The first protocol, with this choice of wait times, does not yield the exact $\pi$ phases required for exact parity mapping (We estimate $\phi_{A1}+\phi_{A2}=0.97\pi$ and $\phi_{B1}+\phi_{B2}=1.03\pi$. These phase errors lead to an estimated infidelity of the joint parity measurement of about 3% for the two-cavity states under this study. Exact phases can be achieved with longer wait times so that $\phi_{A1}+\phi_{A2}=3\pi$ and $\phi_{B1}+\phi_{B2}=5\pi$, but the infidelity due to decoherence and high-order Hamiltonian terms outweighs the benefits. In principle, the second protocol that achieves exact $\pi$ phases at relatively short total gate time should be more advantageous. However, using the second protocol, we observe visibly identical results of joint Wigner tomography of the two-mode cat states with fidelity nearly equal to the first protocol. This may be attributed to extra infidelity from the more complicated ancilla rotations involved in the second protocol.

FIG. 7 is a circuit diagram of an illustrative experimental setup for controlling and/or measuring a system of two quantum mechanical oscillators coupled to an ancilla multi-level quantum system, according to some embodiments. System 700 includes a cQED system 720 which may, for example, be cQED system 300 shown in FIGS. 3A-3B or some other cQED system suitable for practicing the techniques described herein.

System 700 includes three temperatures stages at 15 mK, 4K and 300K, where the cQED system 720 is operated at the 15 mK stage. For instance, the cQED system 720 may be installed inside a Cryoperm magnetic shield and thermalized to the mixing chamber of a dilution refrigerator with a base temperature of 15 mK. Low-pass filters and infrared (eccosorb) filters may be used to reduce stray radiation and photon shot noise. A Josephson parametric converter (JPC) 730 is also mounted to the 15 mK stage, connected to the output port of the device package via circulators, providing near-quantum-limited amplification.

In the example of FIG. 7, a field programmable gate array (FPGA) 740 operates both the quantum-control pulse sequences and the data acquisition process. In some cases, the FPGA may access stored waveforms for application to Alice, Bob and the Ancilla (e.g., for performing rotations, displacements, etc. as described above). In other cases, the FPGA may be programmed to compute rather than store waveforms in real time. This latter approach may lead to lower (or minimal) usage of waveform memory for a large number of different cavity displacements, allowing many measurements in a single run.

In the example of FIG. 7, cavity drives and transmon drives are generated by sideband-modulation of continuous-wave (CW) carrier tones produced by respective microwave generators. The drive waveforms may be applied to each cavity and to the transmon independently. The 4 FPGA analog channels are used as 2 IQ-pairs in unit 750 that each control a cavity drive to implement arbitrary cavity displacements. Rotations of the transmon ancilla are controlled by another pair of IQ channels provided by an arbitrary waveform generator (AWG 760) synchronized to the FPGA via a digital marker. This IQ pair controls both $|g\rangle\_|e\rangle$ and $|e\rangle\_|f\rangle$ transitions by using different intermediate frequencies (IF).

In the example of FIG. 7, ancilla readout may be performed by heterodyne measurement of the microwave transmission of a readout pulse through the two ports of the quasi-planar readout resonator near its resonance frequency. Using a cQED dispersive readout, the amplitude and phase of the transmitted signal depends on the quantum state of the ancilla. This readout pulse is produced by a microwave generator (RO 771) gated by a FPGA digital channel. The transmitted signal, after amplified by the JPC, is further amplified by a high electron mobility transistor (HEMT) at 4K and a regular RF amplifier at room temperature. The amplified signal is then mixed down to 50 MHz with the output of a "local oscillator" (LO 772) microwave generator, and analyzed by the FPGA. A split copy of the readout pulse is directly mixed with the LO without entering the refrigerator to provide a phase reference for the measured transmission.

According to some embodiments, the long lifetimes of the cavities of the cQED system may allow preparation of highly coherent cavity quantum states, but may also severely limit the rate at which one can repeat the measurement process. (With $T_1 \approx 3$ ms for Alice, it takes 15-20 ms for the cavity photon number to naturally decay to the order of 0.01.) Since tomographic measurement of the two-cavity quantum state can require large amounts of measurements, in some cases a four-wave mixing process may be implemented to realize fast reset for both cavities. These processes can effectively convert photons in Alice or Bob into photons in the short-lived readout resonator mode using three parametric pumping tones. For instance, this reset operation could be applied for 400 μs, and then experimental data can be acquired with a repetition cycle of about 900 μs.

FIGS. 8A-8C depict one illustrative physical implementation of cQED system 300 formed from a block of high-purity aluminum. FIG. 8A is a photograph of a machined aluminum package containing two coaxial stub cavity resonators and a transmon. In the example of FIG. 8A, a single block of high-purity (5N5) aluminum has been machined to form a 3D structure that contains both superconducting cavity resonators, and also functions as a package for a sapphire chip with deposited Josephson junction.

Each of the two cavities in FIG. 8A can be considered a 3D version of a) λ/4 transmission line resonator between a center stub (e.g., 3.2 mm in diameter) and a cylindrical wall (outer conductor) (e.g., 9.5 mm in diameter). The heights of the stubs control the resonance frequency, and in the pictured example are about 12.2 mm and 16.3 mm for Alice and Bob, respectively. A tunnel (in the example having a maximum width of 5.8 mm and a maximum height of 3.9 mm) is opened from the outside towards the middle wall between the two cavities, creating a three way joint between the tunnel and the two cavities. The whole package is chemically etched by about 80 μm after machining to improve the surface quality of the cavity resonators.

In the example of FIGS. 8A-8C, the superconducting transmon is on a 5.5 mm×27.5 mm chip, which is diced from a 430 μm-thick c-plane sapphire wafer after fabrication. The transmon on the chip is shown in FIG. 8B. The fabrication process used electron-beam lithography and shadow-mask evaporation of an Al/AlOx/Al Josephson junction. The sapphire chip is inserted into the tunnel, with the antenna pads of the transmon slightly intruding into the coaxial cavities to provide mode coupling. The chip is mechanically held at one end with an aluminum clamping structure and indium seal.

According to some embodiments, during the transmon fabrication process, a 100 μm×9.8 mm strip of aluminum film may be deposited on the sapphire chip to form a readout resonator. This metal strip and the wall of the tunnel form a planar-3D hybrid λ/2 stripline resonator. This resonator design has the advantages of both lithographic dimensional control and low surface/radiation loss. Here, it is capacitively coupled to the transmon, and strongly coupled to a 50Ω transmission line for readout, as shown in FIG. 8C.

Having thus described several aspects of at least one embodiment of this invention, it is to be appreciated that various alterations, modifications, and improvements will readily occur to those skilled in the art.

Such alterations, modifications, and improvements are intended to be part of this disclosure, and are intended to be within the spirit and scope of the invention. Further, though advantages of the present invention are indicated, it should be appreciated that not every embodiment of the technology described herein will include every described advantage. Some embodiments may not implement any features described as advantageous herein and in some instances one or more of the described features may be implemented to achieve further embodiments. Accordingly, the foregoing description and drawings are by way of example only.

According to some aspects, a method is provided of performing a quantum logic gate between a first logical qubit implemented using a first quantum mechanical oscillator and a second logical qubit implemented using a second quantum mechanical oscillator, wherein a nonlinear quantum system is dispersively coupled to the first quantum mechanical oscillator and the nonlinear quantum system is dispersively coupled to the second quantum mechanical oscillator, the method comprising applying a first electromagnetic pulse to the nonlinear quantum system, applying a second electromagnetic pulse to the first quantum mechanical oscillator, and applying a third electromagnetic pulse to the second quantum mechanical oscillator.

According to some embodiments, the quantum logic gate is an entangling gate that entangles the first logical qubit and the second logical qubit.

According to some embodiments, applying a first electromagnetic pulse to the nonlinear quantum system comprises causing a rotation of a state of the nonlinear quantum system, the rotation operation configured to produce a superposition of two energy eigenstates of the nonlinear quantum system, applying a second electromagnetic pulse to the first quantum mechanical oscillator comprises causing a first displacement on the first quantum mechanical oscillator that displaces a state of the first quantum mechanical oscillator by a first phase and a first magnitude, and applying a third electromagnetic pulse to the second quantum mechanical oscillator comprises causing a second displacement on the second quantum mechanical oscillator that displaces a state of the second quantum mechanical oscillator by a second phase and a second magnitude.

According to some embodiments, the method further comprises applying a fourth electromagnetic pulse to the nonlinear quantum system to cause a conditional rotation of the state of the nonlinear quantum system that is based on the state of the state of the first quantum mechanical oscillator and the state of the second quantum mechanical oscillator.

According to some embodiments, the first displacement operation is a conditional displacement operation that displaces the state of the first quantum mechanical oscillator based on the state of the nonlinear quantum system, and the second displacement operation is a conditional displacement operation that displaces the state of the second quantum mechanical oscillator based on the state of the nonlinear quantum system.

According to some embodiments, the first displacement operation is a non-conditional displacement operation that displaces the state of the first quantum mechanical oscillator independent from the state of the nonlinear quantum system, and the second displacement operation is a non-conditional displacement operation that displaces the state of the second quantum mechanical oscillator independent of the state of the nonlinear quantum system, and the method further comprises waiting for a first time, after performing the first displacement operation and the second displacement operation, the waiting for the first time causing the state of the first quantum mechanical oscillator to accumulate a first phase based on the state of the nonlinear quantum system and causing the state of the second quantum mechanical oscillator to accumulate a second phase based on the state of the nonlinear quantum system, wherein the first phase is different from the second phase.

According to some embodiments, the method further comprises applying a fifth electromagnetic pulse to the first quantum mechanical oscillator to cause a third displacement on the first quantum mechanical oscillator that displaces the state of the first quantum mechanical oscillator by a third phase and a third magnitude, wherein the third phase is different from the first phase and/or the third magnitude is different from the first magnitude, and applying a sixth electromagnetic pulse to the second quantum mechanical oscillator to cause a fourth displacement on the second quantum mechanical oscillator that displaces the state of the second quantum mechanical oscillator by a fourth phase and a fourth magnitude, wherein the fourth phase is different from the second phase and/or the fourth magnitude is different from the second magnitude.

According to some embodiments, performing the quantum logic gate comprises performing a joint measurement gate that measures a joint property of a state of the first quantum mechanical oscillator and a state of the second quantum mechanical oscillator.

According to some embodiments, performing a joint measurement gate comprises mapping the joint property to a state of the nonlinear system.

According to some embodiments, the joint property is a joint parity, and wherein the mapping the joint property to the state of the nonlinear system comprises applying a first electromagnetic pulse to the nonlinear quantum system to cause a first rotation of the state of the nonlinear quantum system, the first rotation being a rotation on a Bloch sphere of a first manifold formed by a first energy level of the nonlinear quantum system and a second energy level of the nonlinear quantum system, applying a second electromagnetic pulse to the first quantum mechanical oscillator to impart a first conditional phase on the state of the first quantum mechanical oscillator based on the state of the nonlinear quantum system, applying a third electromagnetic pulse to the second quantum mechanical oscillator to impart a second conditional phase on the state of the second quantum mechanical oscillator based on the state of the nonlinear quantum system, applying a fourth electromagnetic pulse to the nonlinear quantum system to cause a second rotation of the state of the nonlinear quantum system, the second rotation being a rotation on a Bloch sphere of a second manifold formed by the second energy level of the nonlinear quantum and a third energy level of the nonlinear quantum, applying a fifth electromagnetic pulse to the first quantum mechanical oscillator to impart a third conditional phase on the state of the first quantum mechanical oscillator based on the state of the nonlinear quantum system, applying a sixth electromagnetic pulse to the second quantum mechanical to impart a fourth conditional phase on the state of the second quantum mechanical oscillator based on the state of the nonlinear quantum system, applying a seventh electromagnetic pulse to the nonlinear quantum system to cause a third rotation on the state of the nonlinear quantum system, the third rotation being a rotation on the Bloch sphere of the second manifold formed by the second energy level and the third energy level, and applying an eighth electromagnetic pulse to the nonlinear quantum system to cause a fourth rotation on the state of the nonlinear quantum system, the fourth rotation being a rotation on the Bloch sphere of the first manifold formed by the first energy level and the second energy level.

According to some embodiments, a first dispersive coupling between the nonlinear quantum system and the first quantum mechanical oscillator is fixed while performing the quantum logic gate, a second dispersive coupling between the nonlinear quantum system and the second quantum mechanical oscillator is fixed while performing the quantum logic gate, and the first quantum mechanical oscillator is not directly coupled to the second quantum mechanical oscillator.

According to some embodiments, the first dispersive coupling being fixed is a result of the nonlinear quantum system being physically stationary relative to the first quantum mechanical oscillator while performing the quantum logic gate and the resonant frequency of the first quantum mechanical oscillator being fixed while performing the quantum logic gate, and the second dispersive coupling being fixed is a result of the nonlinear quantum system being physically stationary relative to the second quantum mechanical oscillator while performing the quantum logic gate and the resonant frequency of the second quantum mechanical oscillator being fixed while performing the quantum logic gate.

According to some aspects, a circuit quantum electrodynamics system is provided, comprising nonlinear quantum system comprising Josephson junction comprising a first superconducting portion, a second superconducting portion, and an insulating portion, wherein the first superconducting portion and the second superconducting portion are physically separated by the insulating portion, and first antenna electrically connected to the first superconducting portion, second antenna electrically connected to the first superconducting portion, and third antenna electrically connected to the second superconducting portion, a first quantum mechanical oscillator dispersively coupled to the nonlinear quantum system via the first antenna, a second quantum mechanical oscillator dispersively coupled to the nonlinear quantum system via the second antenna, and at least one electromagnetic radiation source configured to independently apply electromagnetic pulses to the nonlinear quantum system, to the first quantum mechanical oscillator, and to the second quantum mechanical oscillator.

According to some embodiments, the first quantum mechanical oscillator comprises a first microwave resonator, and the second quantum mechanical oscillator comprises a second microwave resonator, According to some embodiments, the first microwave resonator is a first three-dimensional superconducting cavity, and the second microwave resonator is a second three-dimensional superconducting cavity.

According to some embodiments, the circuit quantum electrodynamics system further comprises a readout resonator capacitively coupled to the third antenna of the nonlinear quantum system.

According to some embodiments, the nonlinear quantum system is disposed on a first chip and at least a portion of the readout resonator is formed on the first chip.

According to some aspects, a nonlinear quantum device is provided comprising a Josephson junction comprising a first superconducting portion, a second superconducting portion, and an insulating portion, wherein the first superconducting portion and the second superconducting portion are physically separated by the insulating portion, and a first antenna electrically connected to the first superconducting portion, a second antenna electrically connected to the first superconducting portion, and a third antenna electrically connected to the second superconducting portion.

According to some embodiments, the first antenna, the second antenna and the first superconducting portion intersect at a single location.

According to some embodiments, the nonlinear quantum device further comprises a metallic strip capacitively coupled to the third antenna.

Various aspects of the present invention may be used alone, in combination, or in a variety of arrangements not specifically discussed in the embodiments described in the foregoing and is therefore not limited in its application to the details and arrangement of components set forth in the foregoing description or illustrated in the drawings. For example, aspects described in one embodiment may be combined in any manner with aspects described in other embodiments.

Also, the invention may be embodied as a method, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

Various inventive concepts may be embodied as at least one non-transitory computer readable storage medium (e.g., a computer memory, one or more floppy discs, compact discs, optical discs, magnetic tapes, flash memories, circuit configurations in Field Programmable Gate Arrays or other semiconductor devices, etc.) or a computer readable storage device encoded with one or more programs that, when executed on one or more computers or other processors, implement some of the various embodiments of the present invention. The non-transitory computer-readable medium or media may be transportable, such that the program or programs stored thereon may be loaded onto any computer resource to implement various aspects of the present invention as discussed above.

The terms "program," "software," and/or "application" are used herein in a generic sense to refer to any type of computer code or set of computer-executable instructions that can be employed to program a computer or other processor to implement various aspects of embodiments as discussed above. Additionally, it should be appreciated that according to one aspect, one or more computer programs that when executed perform methods of one or more embodiments described herein need not reside on a single computer or processor, but may be distributed in a modular fashion among different computers or processors to implement various aspects of the present invention.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

What is claimed is:

1. A method of operating a system that includes a multi-level quantum system dispersively coupled to a first quantum mechanical oscillator and a second quantum mechanical oscillator, the method comprising:
    applying a first drive waveform to the multi-level quantum system;
    applying one or more second drive waveforms to the first quantum mechanical oscillator to implement a first logical qubit;
    applying one or more third drive waveforms to the second quantum mechanical oscillator to implement a second logical qubit; and
    measuring a state of the multi-level quantum system by using a readout resonator coupled to the multi-level quantum system, wherein:
        the first drive waveform, the one or more second drive waveforms, and the one or more third drive waveforms are together configured to perform a quantum logic gate between the first logical qubit and the second logical qubit, and
        measuring the state of the multi-level quantum system by using the readout resonator comprises measuring an amplitude and a phase of a signal output by the readout resonator.

2. The method of claim 1, wherein:
    the first drive waveform is configured to produce a superposition of states of the multi-level quantum system,
    the one or more second drive waveforms are configured to coherently add or remove energy to or from the first quantum mechanical oscillator conditional on a state of the multi-level quantum system, and
    the one or more third drive waveforms are configured to coherently add or remove energy to or from the second quantum mechanical oscillator conditional on the state of the multi-level quantum system.

3. The method of claim 2, wherein the state of the multi-level quantum system is a superposition of a ground state and a first excited state.

4. The method of claim 3, wherein the one or more second drive waveforms and one or more third drive waveforms are configured to coherently add or remove energy conditional on whether the multi-level quantum system is in the ground state or in the first excited state.

5. The method of claim 3, wherein the one or more second drive waveforms consist of a single drive waveform with a bandwidth smaller than a dispersive frequency shift of the first quantum mechanical oscillator associated with a transition between the ground state and the first excited state of the multi-level quantum system.

6. The method of claim 1, wherein applying the one or more second drive waveforms comprises:
    applying an initial drive waveform to the first quantum mechanical oscillator that coherently adds or removes energy to or from the first quantum mechanical oscillator;
    waiting for a predetermined time subsequent to application of the initial drive waveform; and
    applying a subsequent drive waveform to the first quantum mechanical oscillator that coherently adds or removes energy to or from the first quantum mechanical oscillator.

7. The method of claim 1, wherein prior to application of the first drive waveform, the multi-level quantum system, the first quantum mechanical oscillator, and the second quantum mechanical oscillator are in respective ground states.

8. The method of claim 2, further comprising:
    applying a fourth drive waveform to the multi-level quantum system, the fourth drive waveform configured to change the state of the multi-level system conditional on a state of the first quantum mechanical oscillator and a state of the second quantum mechanical oscillator.

9. The method of claim 1, further comprising measuring joint parity of the first quantum mechanical oscillator and second quantum mechanical oscillator.

10. The method of claim 8, wherein measuring joint parity of the first quantum mechanical oscillator and the second quantum mechanical oscillator comprises:
  applying a fifth drive waveform to the multi-level quantum system;
  waiting for a first predetermined time subsequent to application of the fifth drive waveform;
  applying a sixth drive waveform to the multi-level quantum system;
  waiting for a second predetermined time subsequent to application of the sixth drive waveform; and
  applying a seventh drive waveform to the multi-level quantum system.

11. The method of claim 1, wherein the readout resonator is capacitively coupled to the multi-level quantum system and wherein the readout resonator is further coupled to a transmission line.

12. The method of claim 1, wherein $\chi_B^{ge} > \chi_A^{ge}$,
  where $\chi_A^{ge}$ is a dispersive frequency shift of the first quantum mechanical oscillator associated with a transition between a ground state of the multi-level quantum system and a first excited state of the multi-level quantum system, and
  where $\chi_B^{ge}$ is a dispersive frequency shift of the second quantum mechanical oscillator associated with the transition between the ground state of the multi-level quantum system and the first excited state of the multi-level quantum system.

13. The method of claim 1, wherein the multi-level quantum system is a superconducting transmon.

14. The method of claim 1, wherein the first quantum mechanical oscillator and the second quantum mechanical oscillator are resonator cavities.

15. A circuit quantum electrodynamics system, comprising:
  a multi-level quantum system;
  a first quantum mechanical oscillator configured to store quantum information and dispersively coupled to the multi-level quantum system;
  a second quantum mechanical oscillator configured to store quantum information and dispersively coupled to the multi-level quantum system;
  at least one electromagnetic radiation source configured to apply independent electromagnetic pulses to the multi-level quantum system, to the first quantum mechanical oscillator, and to the second quantum mechanical oscillator; and
  a readout resonator capacitively coupled to the multi-level quantum system,
  wherein the at least one electromagnetic radiation source is configured to:
    produce a superposition of states of the multi-level quantum system; and
    coherently add or remove energy to or from the first and second quantum mechanical oscillators conditional on a state of the multi-level quantum system.

16. The system of claim 15, wherein the multi-level quantum system is a nonlinear quantum system.

17. The system of claim 16, wherein the nonlinear quantum system comprises:
  a Josephson junction comprising a first superconducting portion, a second superconducting portion, and an insulating portion, wherein the first superconducting portion and the second superconducting portion are physically separated by the insulating portion;
  a first antenna electrically connected to the first superconducting portion;
  a second antenna electrically connected to the first superconducting portion; and
  a third antenna electrically connected to the second superconducting portion.

18. The system of claim 17, wherein the first quantum mechanical oscillator is dispersively coupled to the nonlinear quantum system via the first antenna, and wherein the second quantum mechanical oscillator is dispersively coupled to the nonlinear quantum system via the second antenna.

19. The system of claim 15, wherein the multi-level quantum system is a superconducting transmon.

20. The system of claim 15, wherein the first quantum mechanical oscillator and the second quantum mechanical oscillator are resonator cavities.

21. The system of claim 15, wherein the readout resonator is a stripline readout resonator.

22. A nonlinear quantum device comprising:
  a Josephson junction comprising a first superconducting portion, a second superconducting portion, and an insulating portion, wherein the first superconducting portion and the second superconducting portion are physically separated by the insulating portion;
  a first antenna electrically connected to the first superconducting portion;
  a second antenna electrically connected to the first superconducting portion;
  a third antenna electrically connected to the second superconducting portion; and
  a readout resonator capacitively coupled to the third antenna, wherein:
    the first antenna is dispersively coupled to a first quantum mechanical oscillator and the second antenna is dispersively coupled to a second quantum mechanical oscillator, and
    the Josephson junction is disposed outside of the first and second quantum mechanical oscillators.

23. The nonlinear quantum device of claim 22, wherein the first antenna, the second antenna and the first superconducting portion intersect at a single location.

24. The nonlinear quantum device of claim 22, wherein the readout resonator is a metallic strip.

25. The system of claim 15, wherein the at least one electromagnetic radiation source is configured to:
  produce the superposition of states of the multi-level quantum system by applying a first drive waveform to the multi-level quantum system, the first drive waveform configured to produce the superposition of states of the multi-level quantum system; and
  coherently add or remove energy to or from the first and second quantum mechanical oscillators conditional on a state of the multi-level quantum system by:
    applying one or more second drive waveforms to the first quantum mechanical oscillator, the one or more second drive waveforms configured to coherently add or remove energy to or from the first quantum mechanical oscillator conditional on a state of the multi-level quantum system; and
    applying one or more third drive waveforms to the second quantum mechanical oscillator, the one or more third drive waveforms configured to coherently add or remove energy to or from the second quantum mechanical oscillator conditional on the state of the multi-level quantum system.

26. The system of claim 25, wherein at least one of the first drive waveform, the one or more second drive waveforms, and the one or more third drive waveforms are produced by a field programmable gate array (FPGA).

\* \* \* \* \*